US010900829B2

(12) United States Patent
Banine et al.

(10) Patent No.: US 10,900,829 B2
(45) Date of Patent: Jan. 26, 2021

(54) RADIATION SENSOR APPARATUS

(71) Applicant: ASML NETHERLANDS B.V., Veldhoven (NL)

(72) Inventors: Vadim Yevgenyevich Banine, Deurne (NL); Gerrit Jacobus Hendrik Brussaard, Boxtel (NL); Willem Jakobus Cornelis Koppert, Utrecht (NL); Otger Jan Luiten, Eindhoven (NL); Han-Kwang Nienhuys, Utrecht (NL); Job Beckers, Eindhoven (NL); Ruud Martinus Van Der Horst, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 7 days.

(21) Appl. No.: 16/525,641

(22) Filed: Jul. 30, 2019

(65) Prior Publication Data
US 2019/0353521 A1 Nov. 21, 2019

Related U.S. Application Data

(63) Continuation of application No. 15/549,133, filed as application No. PCT/EP2016/052102 on Feb. 2, 2016, now Pat. No. 10,422,691.

(30) Foreign Application Priority Data

Mar. 3, 2015 (EP) .................................. 15157391

(51) Int. Cl.
*G01J 1/58* (2006.01)
*G01J 1/42* (2006.01)
(Continued)

(52) U.S. Cl.
CPC ............... *G01J 1/58* (2013.01); *G01J 1/429* (2013.01); *G01J 1/4257* (2013.01);
(Continued)

(58) Field of Classification Search
CPC . G01J 1/58; G01J 1/4257; G01J 1/429; H01S 3/0903; H01S 3/1305; G01T 1/2018; G03F 7/70558; G03F 7/7085
(Continued)

(56) References Cited

U.S. PATENT DOCUMENTS 3,609,570 A * 9/1971 Gould ....................... H01S 1/06
330/4
3,691,454 A * 9/1972 Hrubesh ................ G01N 22/00
324/316
(Continued)

FOREIGN PATENT DOCUMENTS

DE 3738480 5/1989
EP 1739490 1/2007
(Continued)

OTHER PUBLICATIONS

International Search Report and Written Opinion dated Aug. 8, 2016 in corresponding International Patent Application No. PCT/EP2016/052102.
(Continued)

*Primary Examiner* — David P Porta
*Assistant Examiner* — Gisselle M Gutierrez
(74) *Attorney, Agent, or Firm* — Pillsbury Winthrop Shaw Pittman LLP

(57) ABSTRACT

A radiation sensor apparatus for determining a position and/or power of a radiation beam, the radiation sensor apparatus including a chamber to contain a gas, one or more sensors, and a processor. The chamber has a first opening and a second opening such that a radiation beam can enter
(Continued)

the chamber through the first opening, propagate through the chamber generally along an axis, and exit the chamber through the second opening. Each of the one or more sensors is arranged to receive and detect radiation emitted from a region of the chamber around the axis. The processor is operable to use the radiation detected by the one or more sensors to determine a position and/or power of the radiation beam.

21 Claims, 12 Drawing Sheets

(51) Int. Cl.
| | |
|---|---|
| *H01S 3/13* | (2006.01) |
| *G03F 7/20* | (2006.01) |
| *H01S 3/09* | (2006.01) |
| *G01T 1/20* | (2006.01) |

(52) U.S. Cl.
CPC .......... *G01T 1/2018* (2013.01); *G03F 7/7085* (2013.01); *G03F 7/70558* (2013.01); *H01S 3/0903* (2013.01); *H01S 3/1305* (2013.01)

(58) Field of Classification Search
USPC ...................................................... 250/461.1
See application file for complete search history.

(56) References Cited

U.S. PATENT DOCUMENTS

| | | | |
|---|---|---|---|
| 4,885,471 A | | 12/1989 | Telfair et al. |
| 5,336,533 A | * | 8/1994 | Balmashnov ..... H01J 37/32357 |
| | | | 216/67 |
| 5,548,217 A | | 8/1996 | Gibson et al. |
| 5,963,336 A | | 10/1999 | McAndrew et al. |
| 2008/0116389 A1 | | 5/2008 | Hacker et al. |
| 2011/0272584 A1 | | 11/2011 | Zhang et al. |
| 2011/0273691 A1 | | 11/2011 | Buurman et al. |
| 2013/0043401 A1 | | 2/2013 | Graham et al. |
| 2013/0208742 A1 | | 8/2013 | Mizoguchi et al. |
| 2015/0144808 A1 | * | 5/2015 | Ribton ................ H01J 37/3002 |
| | | | 250/493.1 |
| 2016/0135276 A1 | * | 5/2016 | Abe ........................ H05G 2/003 |
| | | | 250/504 R |
| 2019/0302625 A1 | * | 10/2019 | Engelen ................ G01J 1/0418 |

FOREIGN PATENT DOCUMENTS

| | | |
|---|---|---|
| JP | H0493686 | 3/1992 |
| JP | H0894799 | 4/1996 |
| JP | 2000340395 | 12/2000 |
| KR | 1020140015644 | 2/2014 |
| WO | 2014147901 | 9/2014 |
| WO | 2014202585 | 12/2014 |

OTHER PUBLICATIONS

Van Der Horst, R. M. et al., "Exploring the temporally resolved electron density evolution in extreme ultra-violet induced plasmas", Journal of Physics D: Applied Physics, vol. 47, No. 30, 7 pages (Jul. 2014).

Paris, P. J. et al., "The use of high-order $TM_{0m0}$ modes of a resonant cavity for magnetized plasma density measurements", Journal of Applied Physics, vol. 67, No. 1, pp. 124-129 (1990).

Tiedtke, K. et al., "Gas detectors for x-ray lasers", Journal of Applied Physics, vol. 103, pp. 94511-1-94511-7 (2008).

Japanese Office Action issued in corresponding Japanese Patent Application No. 2017-541903, dated Nov. 29, 2019.

* cited by examiner

US 10,900,829 B2

RADIATION SENSOR APPARATUS

This application is a continuation of U.S. patent application Ser. No. 15/549,133, filed Aug. 4, 2017, which is the U.S. national phase entry of PCT patent application no. PCT/EP2016/052102, which was filed on Feb. 2, 2016, which claims priority to European patent application no. 15157391.2, which was filed on Mar. 3, 2015, each of the foregoing applications is incorporated herein in its entirety by reference.

FIELD

The present invention relates to a radiation sensor apparatus for determining a position and/or power of a radiation beam. In particular, but not exclusively, the radiation sensor apparatus may form part of an EUV lithographic system.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

For lithography and other applications, it may be desirable to be able to measure one or more properties of a radiation beam.

It is an object of the present invention to obviate or mitigate at least one problem of prior art techniques.

SUMMARY

According to a first aspect of the invention there is a provided a radiation sensor apparatus for determining a position and/or power of a radiation beam, the radiation sensor apparatus comprising: a chamber for containing a gas, the chamber being provided with a first opening and a second opening such that a radiation beam can enter the chamber through the first opening, propagate through the chamber generally along an axis, and exit the chamber through the second opening; one or more sensors, each arranged to receive and detect radiation emitted from a region of the chamber around the axis; and a processor operable to use the radiation detected by the one or more sensors to determine a position and/or power of the radiation beam propagating through the chamber generally along the axis.

As a radiation beam passes through the chamber it may interact with matter within the chamber such as, for example, a gas. The gas within the chamber will emit secondary radiation and, in general, there may be a combination of different processes contributing to this secondary radiation. If the radiation beam has a sufficiently high frequency, it may cause ionization of a gas within the chamber. In turn, the resulting free electrons may ionize or excite gas molecules and/or radiate energy by photon emission. Excited gas molecules will undergo spontaneous radiation via photon emission. Therefore, the secondary radiation may be produced by a combination of bound-bound transitions, free-bound transitions and free-free transitions.

The secondary radiation that is emitted by the gas is generally geometrically confined to the region of the chamber which the radiation beam passes through. That is, a volume which is swept out by the radiation beam as it passes through the chamber and which may be referred to in the following as an interaction region. Further, the intensity of the emitted secondary radiation is dependent on the flux of the radiation beam (i.e. the power per unit area). Therefore, the first aspect of the invention uses this secondary radiation emitted from the interaction region to determine a position and/or a power of the radiation beam.

The one or more sensors may be provided with filtering optics arranged to filter out one or more bands of radiation.

This is advantageous since in addition to the secondary radiation, the one or more sensors may receive stray radiation, for example from the radiation beam, which may form a significant background signal. For example, the filtering optics may comprise one or more optics arranged to reduce the amount of radiation from the radiation beam that is received by the one or more sensors. Further, there may be several processes which result in the emission of secondary radiation from the interaction region. In some embodiments, the filtering optics may be arranged to filter out one or more bands of radiation so as to leave one or more bands of radiation which are most strongly and/or accurately correlated with the intensity distribution of radiation beam. The filtering optics may comprise transmissive optics (e.g. lenses), which are arranged to absorb the one or more bands of radiation that are to be filtered out and transmits other bands of radiation. Additionally or alternatively, the filtering optics may comprise reflective optics (e.g. mirrors), which are arranged to absorb the one or more bands of radiation that are to be filtered out and reflects other bands of radiation. Such reflective filtering optics may comprise a mirror provided with a (e.g. dielectric) coating that transmits the one or more bands of radiation that are to be filtered out and reflects other bands of radiation.

The radiation sensor apparatus may comprise two sensors. Each sensor may be arranged to receive and detect radiation emitted from the region of the chamber around the axis in a different direction.

Each of the one or more sensors allows a position of the radiation beam to be determined in a direction in a plane perpendicular to the axis, which may be referred to as the sensing direction of that sensor. The sensing direction of a sensor is generally perpendicular the direction of the secondary radiation from the interaction region that the sensor receives. Therefore, the provision of two sensors each arranged to receive and detect radiation emitted from the region of the chamber around the axis in a different direction, allows a two-dimensional position of the radiation beam to be determined.

The two sensors may be arranged to determine a position of the radiation beam in different directions in a plane perpendicular to the axis. Each sensor may be disposed such that it is pointing in a direction generally perpendicular to the axis. With such an arrangement, each sensor may receive a projection of the interaction region onto a plane parallel to the axis.

The two sensors may be arranged to receive and detect radiation emitted from the region of the chamber around the axis in two generally perpendicular directions.

The one or more sensors may be provided with focusing optics arranged to focus radiation emitted from the region.

The focusing optics may comprise a focusing lens for each or the one or more sensors.

Alternatively, the focusing optics may comprise an array of focusing lenses for each of the one or more sensors.

Such an arrangement, using an array of micro-lenses will be less sensitive to parallax errors, especially for embodiments wherein a diameter of the interaction region is not negligible in comparison to a distance between the interaction region and the focusing optics.

Each of the one or more sensors may be disposed outside of the chamber and the chamber may be provided with one or more windows arranged to transmit radiation from the region to one of the one or more sensors.

An advantage of such an arrangement may be that the one or more sensors do not need to be formed from materials that are compatible with the environment of the chamber. For example, the chamber may be maintained under vacuum conditions. It will be appreciated that a chamber which contains a gas at a pressure below atmospheric pressure may be referred to as being under vacuum conditions. By locating the one or more sensors outside of the chamber they need not be formed from materials which do not suffer from outgassing. Further, the one or more sensors can be accessed (e.g. for maintenance or otherwise) without having to bring the chamber up to atmospheric pressure. Alternatively, the one or more sensors may be disposed inside of the chamber.

The radiation sensor apparatus may further comprise a gas supply mechanism configured to supply a gas into the chamber.

The gas supply mechanism may be configured to maintain a constant pressure of gas in the chamber.

The gas supply mechanism may comprise: a gas supply operable to deliver gas into the chamber; a pump operable to pump gas out of the chamber; and a pressure sensor operable to monitor a pressure of gas within the chamber.

The first and second openings may be provided with a mechanism that allows a pressure difference to be maintained across each of the first and second openings. This mechanism may comprise a plurality of stages that may form part of a differential pumping system.

Each of the one or more sensors may comprise a plurality of sensing elements, each sensing element having a different position in a sensing direction of the sensor.

For example, each of the one or more sensors may comprise an array of sensing elements, each sensing element being sensitive to radiation, and the processor may determine the position of the radiation beam in a sensing direction of each of the one or more sensors to be a centroid of the intensity distribution received by that sensor. For example, each of the one or more sensors may comprise a charged coupled device (CCD) array.

The array of sensing elements may be a one-dimensional array. Readout and data processing of such a one-dimensional array is relatively fast (in comparison for example to a two-dimensional array).

An axis of the one-dimensional array may be disposed at oblique angle to the sensing direction of the sensor. Placing the one-dimensional array such that its axis is disposed at an oblique angle to the sensing direction of the sensor allows the use of an array with larger sensing elements, which results in a sensor with higher sensitivity. Additionally or alternatively, it allows the use of an array with a greater number of sensing elements, which results in a sensor with a higher effective resolution.

Alternatively, the array of sensing elements may be a two-dimensional array. A two-dimensional array has a larger detection area (in comparison to a one-dimensional array), which results in an increase in signal-to-noise ratio.

Each of the one or more sensors may comprise two sensing elements, each sensing element being sensitive to radiation, and the processor may determine the position of the radiation beam in a sensing direction of each of the one or more sensors, as measured from a mid-point of the two sensing elements, to be proportional to the difference in the signals from the two sensing elements. Each of the two sensing elements may for example comprise a photodiode.

An advantage of such an arrangement is that sensor is very fast, compared, for example, to an arrangement wherein each sensor comprises an array of sensing elements. For example, such an arrangement may be suitable for use at a response rate of the order of 1 MHz. Such an arrangement is particularly suitable for monitoring fluctuations in the position of the radiation beam. In order to determine an absolute position of the radiation beam, prior knowledge of the profile (intensity distribution) of the radiation beam may be required.

According to a second aspect of the present invention, there is provided a radiation sensor apparatus for determining a power of a radiation beam, the radiation sensor apparatus comprising: a resonant cavity for containing a gas, the resonant cavity being provided with a first opening and a second opening such that a radiation beam can enter the resonant cavity through the first opening, propagate through the resonant cavity generally along an axis, and exit the resonant cavity through the second opening; a source operable to excite an electromagnetic wave within the resonant cavity; and a processor operable to: measure a resonant frequency of the resonant cavity or a quantity indicative of a resonant frequency of the resonant cavity; and use the measured resonant frequency or quantity indicative of the resonant frequency to determine a power of a radiation beam propagating between the first and second openings.

The resonant frequencies of a resonant cavity are dependent upon the shape and dimensions of the cavity, which determine the boundary conditions for electromagnetic disturbances within the cavity. The resonant frequencies are also dependent upon the speed of light within the cavity, which, in turn, is determined by the permittivity and permeability of the matter within the cavity.

As a radiation beam passes through the resonant cavity it may interact with matter within the resonant cavity. For example, if the radiation has a sufficiently high frequency, it may cause a gas within the resonant cavity to ionize. In general, the density of free electrons within the cavity caused by such ionization is dependent upon the power of the radiation beam. The density of free electrons within the cavity will affect the permittivity and/or permeability within the cavity, which in turn will affect the resonant frequencies of the cavity. In particular, the permittivity within the resonant cavity is dependent upon the density of free electrons within the cavity. Therefore, the first aspect of the invention allows the power of a radiation beam propagating between the first and second openings to be determined from a determined resonant frequency of the resonant cavity. In particular, the first aspect of the invention allows changes in the power of a radiation beam propagating between the first and second openings to be determined from changes in a determined resonant frequency of the resonant cavity.

The source may, for example, comprise a radio frequency supply, an antenna and, optionally, a waveguide arranged to couple the radio frequency supply to the antenna.

The provision of the first and second openings in the resonant cavity arranged such that a radiation beam can enter the resonant cavity through the first opening, propagate through the resonant cavity generally along an axis, and exit the resonant cavity through the second opening allows the power of a radiation beam propagating between the first and second openings to be determined with minimal attenuation of the radiation beam. This is particularly the case if the radiation beam comprises EUV radiation because EUV radiation is strongly absorbed by matter.

The processor may be operable to control the frequency of the electromagnetic wave that is excited within the resonant cavity by the source.

The processor may be operable to control the source so as to sequentially excite a plurality of standing waves with different frequencies in the resonant cavity while simultaneously monitoring the amplitude of the electromagnetic wave within the resonant cavity.

The processor may be operable to determine the resonant frequency of the resonant cavity to be a frequency at which a local maximum occurs in the amplitude of the electromagnetic wave within the resonant cavity.

The radiation sensor apparatus may further comprise a receiver operable to monitor the electromagnetic wave within the resonant cavity. The receiver may be operable to output a signal indicative of the amplitude and/or phase of the electromagnetic wave within the resonant cavity and the processor may be arranged to receive the signal from the receiver.

In order to determine a resonant frequency of the resonant cavity, the processor may be operable to control the source so as to vary the frequency of the electromagnetic wave that is excited within the resonant cavity. The processor may be operable to simultaneously monitor the amplitude of the electromagnetic wave within the resonant cavity. The processor may determine the resonant frequency of the resonant cavity to be a frequency at which a local maximum occurs in the amplitude of the electromagnetic wave within the resonant cavity.

The radiation sensor apparatus may further comprise a directional coupler operable to: monitor a reflected wave received by the source; and output a signal indicative of the amplitude and/or phase of the reflected wave. The processor may be arranged to receive the signal from the directional coupler.

The directional coupler may be further operable to monitor a wave generated by a power supply of the source; and output a signal indicative of the amplitude and/or phase of the wave generated by the power supply of the source, and wherein the processor is arranged to receive the signal from the directional coupler. It will be appreciated that although in some embodiments a directional coupler is used to monitor a reflected wave received by the source and/or a wave generated by a power supply of the source in alternative embodiments the directional coupler may be replaced with any other device that is operable to monitor either or both of the reflected wave received by the source and the wave generated by a power supply of the source.

The processor may be operable to determine a relative phase between an electromagnetic wave supplied by a power supply of the source; and the electromagnetic wave excited within the resonant cavity by the source.

At the resonant frequency of a damped driven harmonic oscillator (such as, for example, a resonant cavity) the amplitude of the system is at a maximum and the response of the system lags behind the driving signal by 90°. At frequencies below the resonant frequency of the system, the phase lag is reduced, with the relative phase tending towards 0° for frequencies well below resonance. At frequencies above the resonant frequency of the system, the phase lag is increased, with the relative phase tending towards 180° for frequencies well above resonance.

The processor may be further operable to determine the resonant frequency of the resonant cavity in dependence on the determined relative phase. Alternatively, the processor may be operable to determine the power of a radiation beam propagating between the first and second openings directly using the determined relative phase. The determined relative phase may be considered to be a quantity indicative of the resonant frequency of the resonant cavity.

The radiation sensor apparatus may further comprise a gas supply mechanism configured to supply a gas into the resonant cavity.

The gas supply mechanism may comprise: a gas supply operable to deliver gas into the resonant cavity; and a pressure sensor operable to monitor a pressure of gas within the resonant cavity.

The gas supply and pressure sensor may form a feedback loop that is operable to control the pressure of gas within the resonant cavity.

The gas supply mechanism may be configured to maintain a constant pressure of gas in the resonant cavity.

The gas supply mechanism may further comprise a pump which is operable to pump gas out of the resonant cavity.

The radiation sensor apparatus may further comprise a mechanism arranged to maintain a constant pressure of gas in the resonant cavity.

The first and second openings may be provided with a mechanism that allows a pressure difference to be maintained across each of the first and second openings.

This mechanism may comprise a plurality of stages that may form part of a differential pumping system.

The source may comprise a first antenna. The first antenna may be disposed within the resonant cavity. Alternatively, the source may further comprise a first waveguide, which may couple the first antenna to the resonant cavity.

The receiver may comprise a second antenna. The second antenna may be disposed within the resonant cavity. Alternatively, the receiver may comprise a second waveguide, which may couple the second antenna to the resonant cavity.

The resonant cavity may have any suitable size and/or shape. In one embodiment, the resonant cavity may be generally cylindrical in shape. An axis of the cylinder may extend between the first and second openings, which may be provided on opposed surfaces of the cylinder.

The radiation sensor apparatus may be suitable for determining a power of an electromagnetic radiation beam, for example EUV radiation.

The radiation sensor apparatus may be suitable for determining a power of a pulsed radiation beam.

According to a third aspect of the invention there is provided a system comprising: a radiation source configured to provide a main radiation beam; and a radiation sensor apparatus as described herein, the radiation sensor apparatus being arranged to determine a power and/or a position of the main radiation beam or a portion of the main radiation beam.

The system may further comprise: at least one lithographic apparatus; and a beam delivery system configured to direct at least a portion of the main radiation beam to the or each lithographic apparatus.

The radiation source may be configured to provide an EUV main radiation beam.

The radiation source may be configured to provide a pulsed radiation beam.

The radiation source may comprise a free electron laser.

According to a fourth aspect of the invention there is provided a lithographic system comprising: a radiation source configured to provide a main radiation beam; at least one lithographic apparatus; a beam delivery system configured to direct at least a portion of the main radiation beam to the or each lithographic apparatus; and a radiation sensor apparatus according to the first aspect of the invention or the second aspect of the invention, the radiation sensor apparatus being arranged to determine at least one of a power and a position of the main radiation beam and/or a portion of the main radiation beam that is directed to one of the at least one lithographic apparatus by the beam delivery system.

The radiation source may, for example, comprise at least one free electron laser.

The radiation source may be configured to provide an EUV main radiation beam.

According to a fifth aspect of the invention there is provided a method for determining a position and/or power of a radiation beam, the method comprising: directing the radiation beam through a chamber containing a gas, the chamber having a first opening and a second opening, wherein the radiation beam enters the chamber through the first opening, propagates through the chamber generally along an axis, and exits the chamber through the second opening; receiving and detecting radiation emitted from a region of the chamber around the axis; and determining a position and/or power of a radiation beam propagating through the chamber generally along the axis, in dependence on the detected radiation.

The radiation beam may comprise electromagnetic radiation in the DUV or EUV range. The radiation beam may be a pulsed radiation beam.

According to a sixth aspect of the invention there is provided a method for determining a power of a radiation beam, the method comprising: directing the radiation beam through a resonant cavity containing a gas, the resonant cavity having a first opening and a second opening, wherein the radiation beam enters the resonant cavity through the first opening, propagates through the resonant cavity, and exits the resonant cavity through the second opening; exciting an electromagnetic wave within the resonant cavity; monitoring the electromagnetic wave within the resonant cavity; determining a resonant frequency of the resonant cavity; and in dependence on the determined resonant frequency determining a power of a radiation beam propagating between the first and second openings.

The radiation beam may comprise electromagnetic radiation in the DUV or EUV range. The radiation beam may be a pulsed radiation beam.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which.

DETAILED DESCRIPTION

Figure 1:
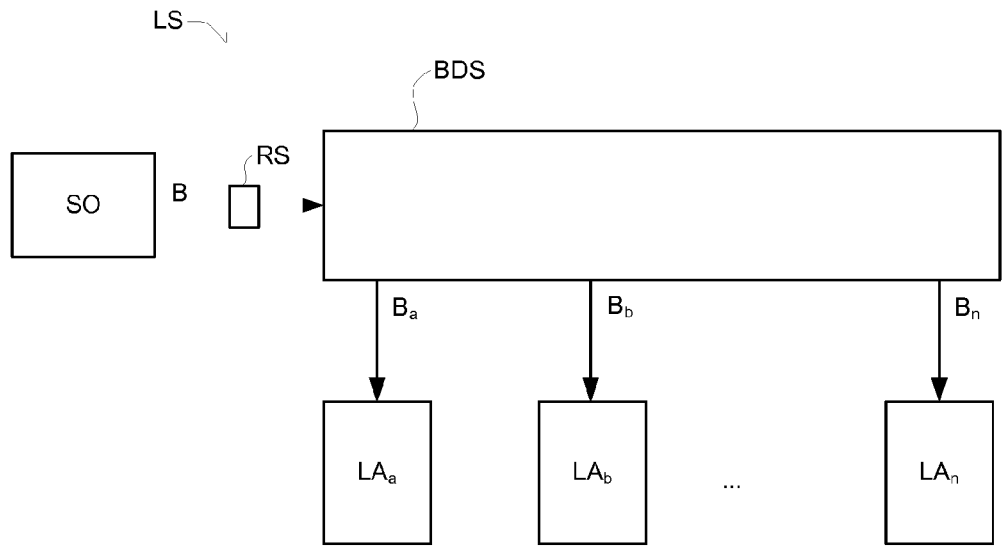
FIG. 1 is a schematic illustration of a lithographic system comprising a free electron laser according to an embodiment of the invention.

FIG. 1 shows a lithographic system LS according to one embodiment of the invention. The lithographic system LS comprises a radiation source SO, a beam delivery system BDS a plurality of lithographic apparatus $LA_a$-$LA_n$ (e.g. eight lithographic apparatus). The radiation source SO is configured to generate an extreme ultraviolet (EUV) radiation beam B (which may be referred to as a main beam).

The beam delivery system BDS comprises beam splitting optics and may optionally also comprise beam expanding optics and/or beam shaping optics. The main radiation beam B is split into a plurality of radiation beams $B_a$-$B_n$ (which may be referred to as branch beams), each of which is directed to a different one of the lithographic apparatus $LA_a$-$LA_n$, by the beam delivery system BDS.

The lithographic system LS further comprises one or more radiation sensor apparatus RS according to an embodiment of the invention. As shown in FIG. 1, lithographic system LS comprises a radiation sensor apparatus RS which is arranged to measure one or more properties (e.g. the power and/or the position) of the main beam B. Additionally or alternatively, lithographic system LS may comprise a radiation sensor apparatus RS that is arranged to measure one or more properties of a branch radiation beam $B_a$-$B_n$. Additionally or alternatively, lithographic system LS may comprise a radiation sensor apparatus RS arranged to measure one or more properties of a radiation beam within the beam delivery system BDS.

The optional beam expanding optics (not shown) are arranged to increase the cross-sectional area of the radiation beam B. Advantageously, this decreases the heat load on mirrors downstream of the beam expanding optics. This may allow the mirrors downstream of the beam expanding optics to be of a lower specification, with less cooling, and therefore less expensive. Additionally or alternatively, it may allow the downstream mirrors to be nearer to normal incidence. For example, the beam expanding optics may be operable to expand the main beam B from approximately 100 µm to more than 10 cm before the main beam B is split by the beam splitting optics.

In an embodiment, the branch radiation beams $B_a$-$B_n$ are each directed through a respective attenuator (not shown). Each attenuator may be arranged to adjust the intensity of a respective branch radiation beam $B_a$-$B_n$ before the branch radiation beam $B_a$-$B_n$ passes into its corresponding lithographic apparatus $LA_a$-$LA_n$.

The radiation source SO, beam delivery system BDS and lithographic apparatus $LA_a$-$LA_n$ may all be constructed and arranged such that they can be isolated from the external environment. A vacuum may be provided in at least part of the radiation source SO, beam delivery system BDS and lithographic apparatuses $LA_a$-$LA_n$ so as to minimise the absorption of EUV radiation. Different parts of the lithographic system LS may be provided with vacuums at different pressures (i.e. held at different pressures which are below atmospheric pressure).

Figure 2:
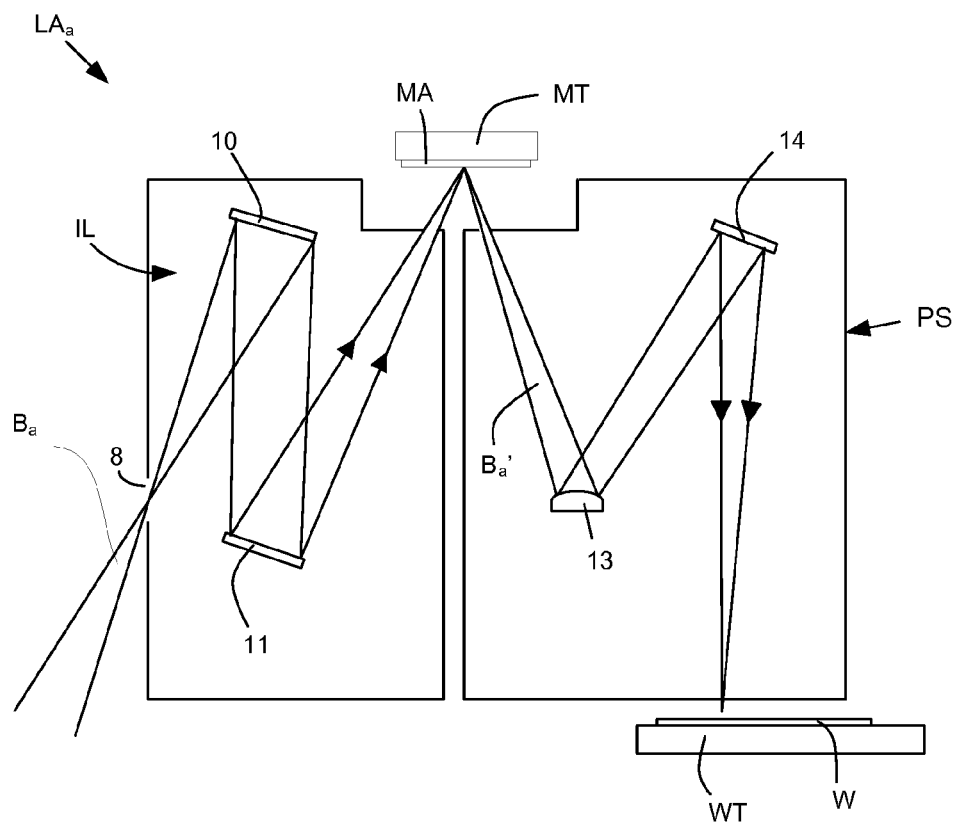
FIG. 2 is a schematic illustration of a lithographic apparatus that forms part of the lithographic system of FIG. 1.

Referring to FIG. 2, a lithographic apparatus $LA_a$ comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus $LA_a$ before it is incident upon the patterning device MA. The projection system PS is configured to project the radiation beam $B_a$' (now patterned by the patterning device MA) onto the substrate W. The substrate W may include previously formed patterns. Where this is the case, the lithographic apparatus aligns the patterned radiation beam $B_a$' with a pattern previously formed on the substrate W.

The branch radiation beam $B_a$ that is received by the lithographic apparatus $LA_a$ passes into the illumination system IL from the beam delivery system BDS though an opening 8 in an enclosing structure of the illumination system IL. Optionally, the branch radiation beam $B_a$ may be focused to form an intermediate focus at or near to the opening 8.

The illumination system IL may include a facetted field mirror device 10 and a facetted pupil mirror device 11. The faceted field mirror device 10 and faceted pupil mirror device 11 together provide the radiation beam $B_a$ with a desired cross-sectional shape and a desired angular distribution. The radiation beam $B_a$ passes from the illumination system IL and is incident upon the patterning device MA held by the support structure MT. The patterning device MA reflects and patterns the radiation beam to form a patterned beam $B_a$'. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be microelectromechanical systems (MEMS) devices.

Following redirection (e.g. reflection) from the patterning device MA the patterned radiation beam $B_a$' enters the projection system PS. The projection system PS comprises a plurality of mirrors 13, 14 which are configured to project the radiation beam $B_a$' onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 2, the projection system may include any number of mirrors (e.g. six mirrors).

The lithographic apparatus $LA_a$ is operable to impart a radiation beam $B_a$ with a pattern in its cross-section and project the patterned radiation beam onto a target portion of a substrate thereby exposing a target portion of the substrate to the patterned radiation. The lithographic apparatus $LA_a$ may, for example, be used in a scan mode, wherein the support structure MT and the substrate table WT are scanned synchronously while a pattern imparted to the radiation beam $B_a$' is projected onto a substrate W (i.e. a dynamic exposure). The velocity and direction of the substrate table WT relative to the support structure MT may be determined by the demagnification and image reversal characteristics of the projection system PS.

Referring again to FIG. 1, the radiation source SO is configured to generate an EUV radiation beam B with sufficient power to supply each of the lithographic apparatus $LA_a$-$LA_n$. As noted above, the radiation source SO may comprise a free electron laser.

Figure 3:
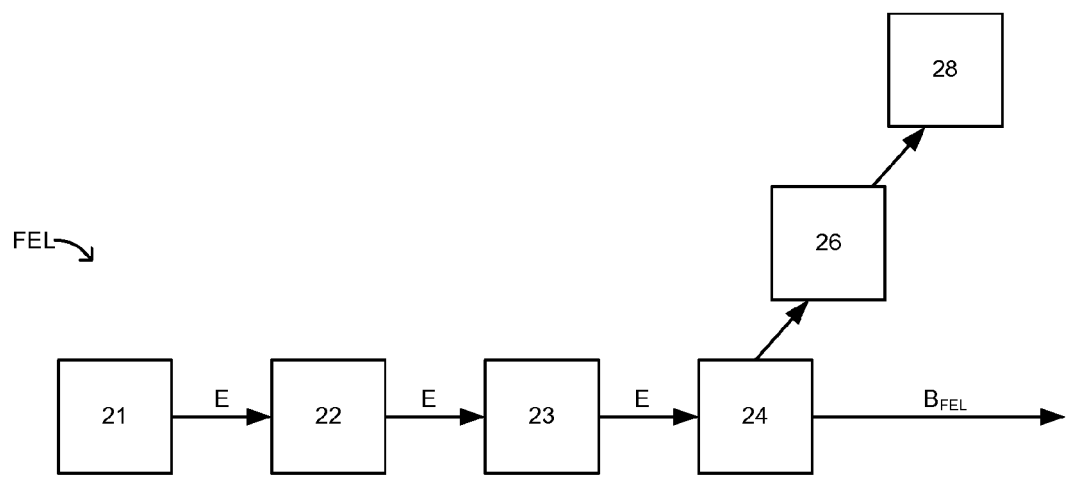
FIG. 3 is a schematic illustration of a free electron laser that forms part of the lithographic system of FIG. 1.

FIG. 3 is a schematic depiction of a free electron laser FEL comprising an injector 21, a linear accelerator 22, a bunch compressor 23, an undulator 24, an electron decelerator 26 and a beam dump 28.

The injector 21 is arranged to produce a bunched electron beam E and comprises an electron source (for example a thermionic cathode or a photo-cathode) and an accelerating electric field. Electrons in the electron beam E are further accelerated by the linear accelerator 22. In an example, the linear accelerator 22 may comprise a plurality of radio frequency cavities, which are axially spaced along a common axis, and one or more radio frequency power sources, which are operable to control the electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the cavities may be conventionally conducting (i.e. not superconducting), and may be formed from, for example, copper. Other types of linear accelerators may be used such as, for example, laser wake-field accelerators or inverse free electron laser accelerators.

Optionally, the electron beam E passes through a bunch compressor 23, disposed between the linear accelerator 22 and the undulator 24. The bunch compressor 23 is configured to spatially compress existing bunches of electrons in the electron beam E. One type of bunch compressor 23 comprises a radiation field directed transverse to the electron beam E. An electron in the electron beam E interacts with the radiation and bunches with other electrons nearby. Another type of bunch compressor 23 comprises a magnetic chicane, wherein the length of a path followed by an electron as it passes through the chicane is dependent upon its energy. This type of bunch compressor may be used to compress bunches of electrons which have been accelerated in a linear accelerator 22 by a plurality of resonant cavities.

The electron beam E then passes through the undulator 24. Generally, the undulator 24 comprises a plurality of modules. Each module comprises a periodic magnet structure, which is operable to produce a periodic magnetic field and is arranged so as to guide the relativistic electron beam E produced by the injector 21 and linear accelerator 22 along a periodic path within that module. The periodic magnetic field produced by each undulator module causes the electrons to follow an oscillating path about a central axis. As a result, within each undulator module, the electrons radiate electromagnetic radiation generally in the direction of the central axis of that undulator module.

The path followed by the electrons may be sinusoidal and planar, with the electrons periodically traversing the central axis. Alternatively, the path may be helical, with the electrons rotating about the central axis. The type of oscillating path may affect the polarization of radiation emitted by the free electron laser. For example, a free electron laser which causes the electrons to propagate along a helical path may emit elliptically polarized radiation, which may be desirable for exposure of a substrate W by some lithographic apparatus.

As electrons move through each undulator module, they interact with the electric field of the radiation, exchanging energy with the radiation. In general the amount of energy exchanged between the electrons and the radiation will oscillate rapidly unless conditions are close to a resonance condition. Under resonance conditions, the interaction between the electrons and the radiation causes the electrons to bunch together into microbunches, modulated at the wavelength of radiation within the undulator, and coherent emission of radiation along the central axis is stimulated. The resonance condition may be given by:

$$\lambda_{em} = \frac{\lambda_u}{2\gamma^2}\left(1 + \frac{K^2}{A}\right), \quad (1)$$

where $\lambda_{em}$ is the wavelength of the radiation, $\lambda_u$ is the undulator period for the undulator module that the electrons are propagating through, $\gamma$ is the Lorentz factor of the electrons and K is the undulator parameter. A is dependent upon the geometry of the undulator 24: for a helical undulator that produces circularly polarized radiation A=1, for a planar undulator A=2, and for a helical undulator which produces elliptically polarized radiation (that is neither circularly polarized nor linearly polarized) 1<A<2. In practice, each bunch of electrons will have a spread of energies although this spread may be minimized as far as possible (by producing an electron beam E with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through each undulator module. The free electron laser FEL may operate in self-amplified spontaneous emission (SASE) mode. Operation in SASE mode may require a low energy spread of the electron bunches in the electron beam E before it enters each undulator module. Alternatively, the free electron laser FEL may comprise a seed radiation source, which may be amplified by stimulated emission within the undulator 24. The free electron laser FEL may operate as a recirculating amplifier free electron laser (RAFEL), wherein a portion of the radiation generated by the free electron laser FEL is used to seed further generation of radiation.

Electrons moving through the undulator 24 may cause the amplitude of radiation to increase, i.e. the free electron laser FEL may have a non-zero gain. Maximum gain may be achieved when the resonance condition is met or when conditions are close to but slightly off resonance.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator 24 in order to keep bunches of electrons at or close to resonance as they are guided though the undulator 24. The tapering may be achieved by varying the amplitude of the periodic magnetic field and/or the undulator period $\lambda_u$ within each undulator module and/or from module to module. Additionally or alternatively tapering may be achieved by varying the helicity of the undulator 24 (by varying the parameter A) within each undulator module and/or from module to module.

A region around the central axis of each undulator module may be considered to be a "good field region". The good field region may be a volume around the central axis wherein, for a given position along the central axis of the undulator module, the magnitude and direction of the magnetic field within the volume are substantially constant. An electron bunch propagating within the good field region may satisfy the resonant condition of Eq. (1) and will therefore amplify radiation. Further, an electron beam E propagating within the good field region should not experience significant unexpected disruption due to uncompensated magnetic fields. That is, an electron propagating through the good field region should remain within the good field region.

Each undulator module may have a range of acceptable initial trajectories. Electrons entering an undulator module with an initial trajectory within this range of acceptable initial trajectories may satisfy the resonant condition of Eq. (1) and interact with radiation in that undulator module to stimulate emission of coherent radiation. In contrast, electrons entering an undulator module with other trajectories may not stimulate significant emission of coherent radiation.

For example, generally, for helical undulator modules the electron beam E should be substantially aligned with the central axis of the undulator module. A tilt or angle between the electron beam E and the central axis of the undulator module (in micro-radians) should generally not exceed $\frac{1}{10}$ $\rho$, where $\rho$ is the FEL Pierce parameter. Otherwise the conversion efficiency of the undulator module (i.e. the portion of the energy of the electron beam E which is converted to radiation in that module) may drop below a desired amount (or may drop almost to zero). In an embodiment, the FEL Pierce parameter of an EUV helical undulator module may be of the order of 0.001, indicating that the tilt of the electron beam E with respect to the central axis of the undulator module should be less than 100 μrad.

For a planar undulator module, a greater range of initial trajectories may be acceptable. Provided the electron beam E remains substantially perpendicular to the magnetic field of a planar undulator module and remains within the good field region of the planar undulator module, coherent emission of radiation may be stimulated.

As electrons of the electron beam E move through a drift space between each undulator module, the electrons do not follow a periodic path. Therefore, in this drift space, although the electrons overlap spatially with the radiation, they do not exchange any significant energy with the radiation and are therefore effectively decoupled from the radiation. The bunched electron beam E has a finite emittance and will therefore increase in diameter unless refocused. Therefore, the undulator 24 may further comprise a mechanism for refocusing the electron beam E in between one or more pairs of adjacent undulator modules. For example, a quadrupole magnet may be provided between each pair of adjacent modules. The quadrupole magnets reduce the size of the electron bunches. This improves the coupling between the electrons and the radiation within the next undulator module, increasing the stimulation of emission of radiation.

The undulator 24 may further comprise an electron beam steering unit in between each adjacent pair of undulator modules which is arranged to provide fine adjustment of the electron beam E as it passes through the undulator 24. For example, each beam steering unit may be arranged to ensure that the electron beam remains within the good field region and enters the next undulator module with a trajectory from the range of acceptable initial trajectories for that undulator module.

After leaving the undulator 24, the electron beam E is absorbed by a dump 28. The dump 28 may comprise a sufficient quantity of material to absorb the electron beam E. The material may have a threshold energy for induction of radioactivity. Electrons entering the dump 28 with an energy below the threshold energy may produce only gamma ray showers but will not induce any significant level of radioactivity. The material may have a high threshold energy for induction of radioactivity by electron impact. For example, the beam dump may comprise aluminium (Al), which has a threshold energy of around 17 MeV. It may be desirable to reduce the energy of electrons in the electron beam E before they enter the dump 28. This removes, or at least reduces, the need to remove and dispose of radioactive waste from the dump 28. This is advantageous since the removal of radioactive waste requires the free electron laser FEL to be shut down periodically and the disposal of radioactive waste can be costly and can have serious environmental implications.

The energy of electrons in the electron beam E may be reduced before they enter the dump 28 by directing the electron beam E through a decelerator 26 disposed between the undulator 24 and the beam dump 28.

In an embodiment the electron beam E which exits the undulator 24 may be decelerated by passing the electrons back through the linear accelerator 22 with a phase difference of 180 degrees relative to the electron beam produced by the injector 21. The RF fields in the linear accelerator therefore serve to decelerate the electrons which are output from the undulator 24 and to accelerate electrons output from the injector 21. As the electrons decelerate in the linear accelerator 22 some of their energy is transferred to the RF fields in the linear accelerator 22. Energy from the decelerating electrons is therefore recovered by the linear accelerator 22 and may be used to accelerate the electron beam E output from the injector 21. Such an arrangement is known as an energy recovery linear accelerator (ERL).

In some embodiments of a lithographic system LS the radiation source SO may comprise a single free electron laser FEL. In such embodiments the main beam B which is emitted from the radiation source SO may be a laser beam $B_{FEL}$ which is emitted from the free electron laser FEL. In other embodiments, a lithographic system LS may comprise a plurality of free electron lasers. A plurality of laser beams $B_{FEL}$ emitted from the free electron lasers may be combined to form a single main beam B comprising radiation emitted from the plurality of free electron lasers FEL.

It is desirable in a lithographic system LS to regulate a dose of radiation which is provided to a substrate W by a lithographic apparatus $LA_a$. The dose of radiation which is provided to a substrate W is dependent on the power of a branch radiation beam $B_a$ which is provided to a lithographic apparatus $LA_a$. The dose of radiation may therefore be controlled by controlling the power of a branch radiation beam $B_a$. In order to control the power of a branch radiation beam $B_a$, the power of the branch radiation beam $B_a$ and/or the main beam B may be measured using one or more radiation sensor apparatus RS (such as the radiation sensor apparatus RS shown in FIG. 1). A radiation sensor apparatus RS may form part of a feedback system which is configured to control the power of the main beam B and/or the power of a branch radiation beam $B_a$ so as to regulate the dose provided at a substrate W. For example, the power of the main beam B and/or the power of a branch radiation beam $B_a$ may be adjusted in response to a measurement made by one or more radiation sensor apparatus RS so as to provide a branch radiation beam having a desired power. The feedback system may comprise a controller and may be automated. The power of the main beam B and/or the power of a branch radiation beam $B_a$ may be adjusted, for example, by arranging one or more attenuators in the path of the main beam B and/or a branch beam $B_a$. An attenuator may be controlled so as to adjust the intensity of the main beam B and/or a branch beam $B_a$ in response to a measurement made by a radiation sensor apparatus RS so as to provide a branch radiation beam $B_a$ having a desired power.

It is further desirable in a lithographic system LS to measure the position of radiation beams propagating through the lithographic system LS. For example, the position of one or more radiation beams may be measured with a radiation sensor apparatus RS in order to check the alignment of one or more optical components of the lithographic system LS. For example, the alignment of one or more optical components which form the beam delivery system BDS may be checked by measuring the position of a branch radiation beam $B_a$ which is provided by the beam delivery system BDS. A radiation sensor apparatus RS which measures the position of a radiation beam may form part of a feedback system which is configured to control the alignment of one or more optical components of the lithographic system LS. For example, the alignment of one or more optical components of the lithographic system LS may be controlled in response to a measurement of the position of a radiation beam. The feedback system may comprise a controller and may be automated. A radiation sensor apparatus RS may, for example, be arranged to measure the position of a branch radiation beam $B_a$ prior to the branch radiation beam $B_a$ being provided to a lithographic apparatus $LA_a$. In the event that the position of the branch radiation beam $B_a$ deviates from a desired position of the beam the alignment of, for example, one or more optical components in the beam delivery system BDS may adjusted so as to correct the deviation in position of the branch radiation beam $B_a$.

Embodiments of a first type of radiation sensor apparatus which is suitable for use in a lithographic system LS are now described with reference to FIGS. 4 to 12.

Figure 4:
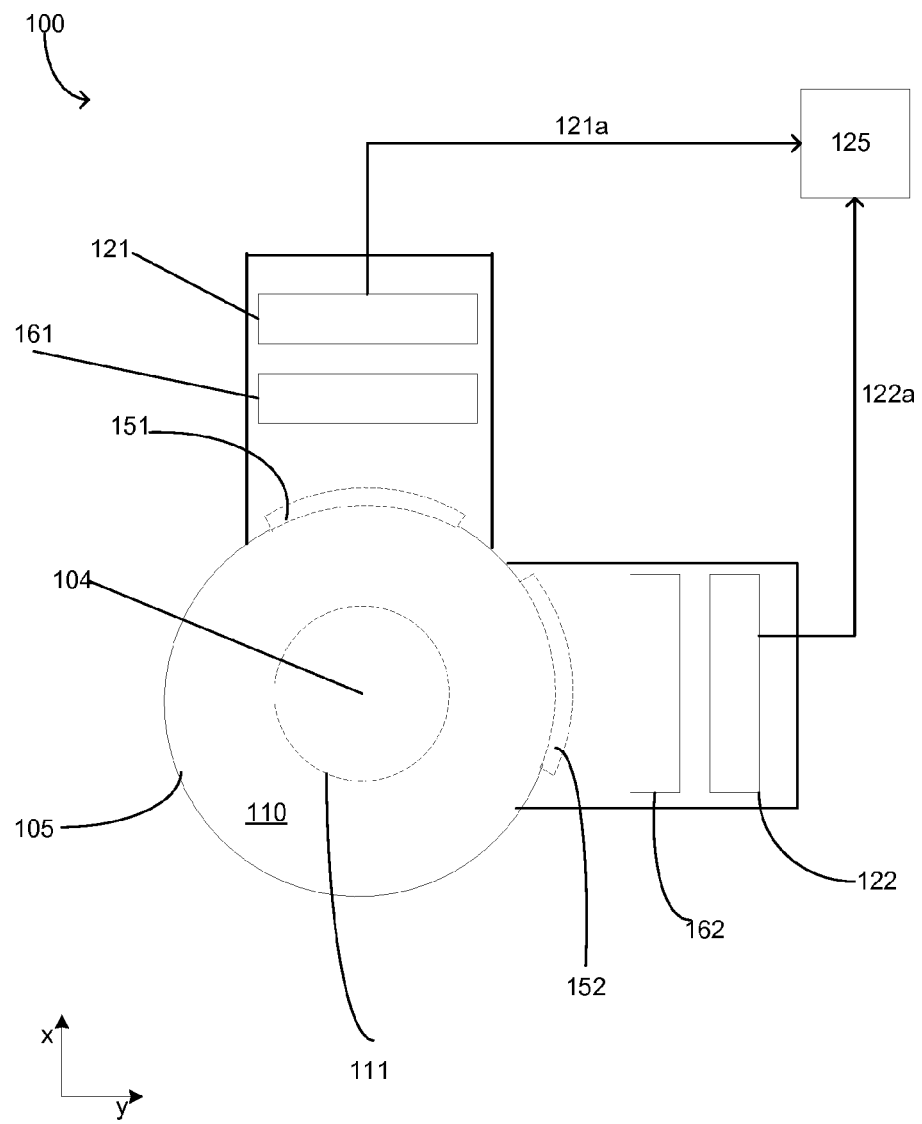
FIG. 4 is a schematic illustration of a first type of radiation sensor apparatus which may form part of the lithographic system of FIG. 1 in cross section in a plane perpendicular to its axis.
Figure 5:
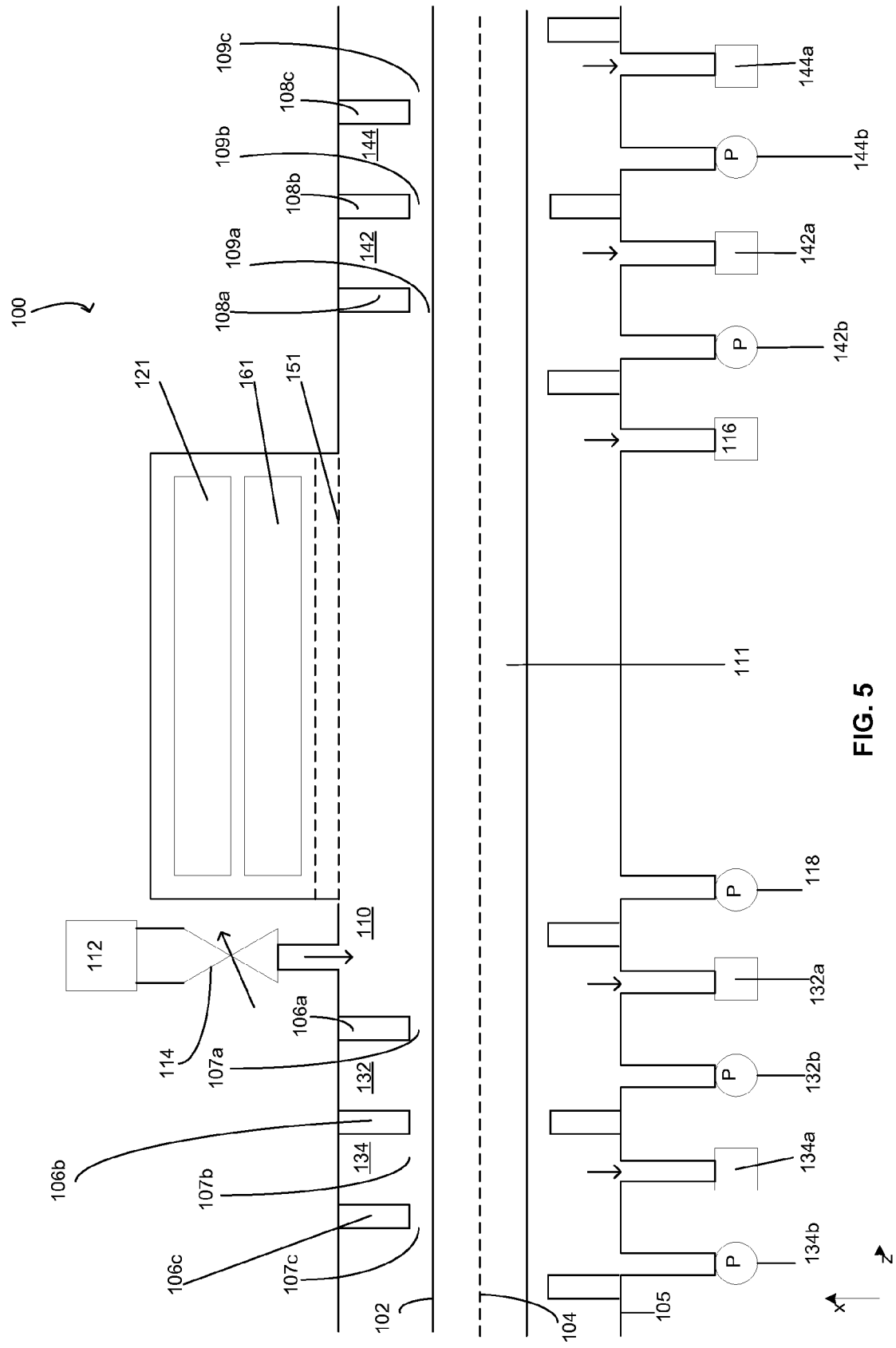
FIG. 5 is a schematic illustration of the radiation sensor apparatus of FIG. 4 in cross section in a plane containing its axis.

FIGS. 4 and 5 are schematic illustrations of a radiation sensor apparatus 100 which is suitable for use in a lithographic system LS. The radiation sensor apparatus 100 is configured to measure the power and/or the position of a radiation beam 102, as now described. Radiation sensor apparatus RS of FIG. 1 may for example comprise radiation sensor apparatus 100.

Radiation sensor apparatus 100 comprises a chamber 110, two sensors 121, 122 and a processor 125.

The chamber 110 is generally cylindrical and forms part of a beam pipe 105 for a radiation beam 102. Although in this embodiment chamber 110 is generally cylindrical, it will be appreciated that in other embodiments the chamber may have a different shape. The chamber 110 may be axially symmetric. The radiation beam 102 may for example comprise EUV radiation. Since EUV radiation is generally well absorbed by matter, for such embodiments, the pipe 105 may be under vacuum conditions (i.e. at a pressure below atmospheric pressure) so as to minimise attenuation of the radiation beam 102 due to absorption. In optical systems, for example lithographic systems, using EUV radiation reflective optical elements may be used in preference to transmissive optical elements. Further, it is known to provide hydrogen gas in the vicinity of such reflective optical elements since in the presence of EUV radiation such hydrogen gas may have a cleaning effect on optical surfaces. For example, the hydrogen gas may be provided at pressures below atmospheric pressure, for example below 100 Pa, for example below 5 Pa.

The chamber 110 is suitable for containing a gas. The radiation sensor apparatus 100 is provided with a gas supply 112, which is operable to introduce gas into the chamber 110. Gas passes into the chamber 110 from the gas supply 112 via a valve 114. The valve 114 may be a variable valve operable to adjust the rate at which gas is introduced into the chamber 110. The chamber 110 is further provided with a pump 116 which is configured to pump gas out of the chamber 110. The pump 116 may be operable to adjust the rate at which gas is pumped out of the chamber 110. A pressure sensor 118 is arranged to measure the pressure inside the chamber 110. The gas supply 112, the valve 114 and/or the pump 116 may be controlled in response to measurements of the pressure inside the chamber 110 (made by the pressure sensor 118) so as to maintain a desired pressure inside the chamber 110. The gas supply 112, the valve 114, the pump 116 and the pressure sensor 118 may together be considered to be an example of a gas supply mechanism configured to supply gas into the chamber 110.

The chamber 110 is provided with a first opening 107a and a second opening 109a. In use, radiation beam 102 enters the chamber 110 through the first opening 107a, propagates through the chamber 110 generally along a central axis 104 (z direction in FIGS. 4 and 5), and exits the chamber 110 through the second opening 109a.

In use, as radiation beam 102 passes through the chamber 110 it may interact with gas within the chamber 110. As a result, the gas within the chamber 110 will emit secondary radiation (via fluorescence). The secondary radiation comprises electromagnetic radiation which may have a range of different frequencies. The secondary radiation may comprise light in the near-infrared to ultraviolet range. The secondary radiation may comprise radiation with wavelengths in the range 150 nm to 10 μm, in particular in the range 200 nm to 1100 nm.

In general, there may be a combination of different processes contributing to this secondary radiation. If the radiation beam 102 has a sufficiently high frequency, it may cause ionization of gas within the chamber 110. In turn, the resulting free electrons may ionize or excite gas molecules. Free electrons that result from the ionization of gas within the chamber may radiate energy by photon emission (i.e. free-free transitions). Free electrons may recombine with ions within the chamber 110 and this recombination may result in the radiation of energy by photon emission (i.e. free-bound transitions). Excited gas molecules within the chamber 110 will spontaneously emit photons (i.e. bound-bound transitions). Therefore, the secondary radiation may be produced by a combination of bound-bound transitions, free-bound transitions and free-free transitions.

The secondary radiation that is emitted by the gas is generally geometrically confined to a region 111 of the chamber 110 which the radiation beam passes 102 through. This region 111 is a volume which is swept out by the radiation beam 102 as it passes through the chamber 110 and which may be referred to in the following as the interaction region 111. Since the radiation beam 102 propagates generally along the central axis 104, the interaction region 111 is a region of the chamber 110 around the central axis 104.

It will be appreciated that laser beams (such as radiation beam 102) typically do not have sharp edges. For example, the intensity profile of radiation beam 102 may be Gaussian-like, and therefore the edge of the radiation beam 102 may be defined in a number of different ways. As a result, the interaction region 111 may not have sharp edges and a boundary of the interaction region 111 may be defined in a number of different ways. For example, the edge of the radiation beam 102 may be defined as the point at which the intensity of the radiation beam 102 falls below a threshold value. If the intensity distribution of the radiation beam 102 is rotationally symmetric then the edge of the radiation beam 102 will be a circle and the interaction region 111 will be cylindrical in shape.

The intensity of the secondary radiation emitted by the gas in a given region of the chamber 110 is dependent on the flux of the radiation beam 102 (i.e. the power per unit area) through that region. Therefore, if the intensity profile of radiation beam 102 is Gaussian-like then more secondary radiation will be emitted from parts of the interaction region 111 that are closer to the centre of the radiation beam 102 (i.e. near central axis 104) than parts of the interaction region 111 that are closer to the edge of the interaction region 111.

Each of the two sensors 121, 122 is arranged to receive and detect radiation emitted from interaction region 111 of the chamber 110. Some embodiments of the invention use the secondary radiation from the interaction region 111 to determine a position and/or a power of the radiation beam 102.

The gas supplied by gas supply 112 may be any suitable gas. Suitable gases may include any gas which produces secondary radiation of a suitable wavelength (e.g. visible light) and with a suitable cross section to allow a position and/or a power of the radiation beam 102 to be determined therefrom. Suitable gases may include any gases which are relatively (chemically) unreactive.

Suitable gases may include, for example, hydrogen and noble gases such as, for example, helium, neon, argon and xenon.

For embodiments wherein the radiation beam 102 comprises EUV radiation, hydrogen may be advantageous since hydrogen gas may already be present within beam pipe 105. Hydrogen gas may be chosen to be present within beam pipe 105 due to its relatively low absorption cross section for EUV radiation. Such embodiments will not require a gas supply 112 (i.e. hydrogen may be supplied from a gas supply that does not form part of the radiation sensor apparatus). Further, hydrogen gas may be less sensitive to saturation effects caused by a multi-kilowatt EUV radiation beam 102. The choice of a suitable gas may be dependent upon any of the following factors: linearity between the intensity of secondary radiation to the intensity of the radiation beam 102; whether or not the gas will reach saturation; and the strength of the signal received by the sensors 121, 122.

The gas supply mechanism (i.e. gas supply 112, valve 114, pump 116 and pressure sensor 118) may be configured to maintain a substantially constant pressure inside the chamber 110. The pressure maintained inside the chamber 110 by the gas supply mechanism may be dependent upon the type of gas. In some embodiments the gas supply mechanism may be configured to maintain hydrogen inside the chamber 110 at a pressure of between 0.01 Pa and 1 Pa.

The chamber 110 is provided with a mechanism that allows a pressure difference to be maintained across each of the first and second openings 107a, 109a. This allows the pressure of a gas within the chamber 110 to be controlled over a greater range. As now described, the mechanism that allows a pressure difference to be maintained across each of the first and second openings 107a, 109a comprises a plurality of stages that form part of a differential pumping system.

As explained above, the radiation sensor apparatus 100 forms a portion of beam pipe 105 along which the radiation beam 102 propagates. The beam pipe 105 is provided with a first set of (for example three) aperture plates 106a-106c and a second set of (for example three) aperture plates 108a-108c. Each of the aperture plates 106a-106c, 108a-108c extends across the beam pipe 105 generally perpendicularly to the central axis 104. Each of the aperture plates 106a-106c, 108a-108c is generally annular in shape, being provided with a central aperture 107a-107c, 109a-109c.

Two of the aperture plates 106a, 108a and the beam pipe 105 together define the chamber 110 through which the radiation beam 102 propagates. The central aperture 107a in aperture plate 106a forms the first opening of the chamber 110 and the central aperture 109a in aperture plate 108a forms the second opening of the chamber 110.

The provision of a plurality of aperture plates on opposite sides of the chamber 110 defines one or more outer chambers, said outer chambers being disposed between the chamber 110 and the main body of the beam pipe 105. In particular, aperture plates 106a and 106b define a first outer chamber 132 adjacent to a first end of chamber 110 and aperture plates 106b and 106c define a second outer chamber 134 adjacent to chamber 110 at its first end. Similarly, aperture plates 108a and 108b define a first outer chamber 142 adjacent to a second end of chamber 110 and aperture plates 108b and 108c define a second outer chamber 144 adjacent to chamber 110 at its second end.

Each of the first outer chambers 132, 142 is provided with a pump 132a, 142a, which is configured to pump gas out of that chamber, and a pressure sensor 132b, 142b, which is arranged to measure the pressure inside that chamber. Each of the second outer chambers 134, 144 are provided with a pump 134a, 144a, which is configured to pump gas out of that chamber, and a pressure sensor 134b, 144b, which is arranged to measure the pressure inside that chamber. These pumps 132a, 142a, 134a, 144a and pressure sensors 132b, 142b, 134b, 144b may form part of the gas supply mechanism (along with gas supply 112, valve 114, pump 116 and pressure sensor 118). All of the pumps 116, 132a, 142a, 134a, 144a may be controlled in response to measurements of the pressure inside the chambers 110, 132, 142, 134, 144 (made by the pressure sensors 118, 132b, 142b, 134b, 144b) so as to maintain a desired pressure inside the chamber 110.

Each of the two sensors 121, 122 is disposed outside of the chamber 110. The chamber 110 is provided with a first window 151 and a second window 152. The first window 151 is arranged to transmit radiation from the interaction region 111 to a first one of the sensors 121. The second window 152 is arranged to transmit radiation from the interaction region 111 to a second one of the sensors 122. An advantage of such an arrangement is that the sensors 121, 122 do not need to be formed form materials that are compatible with vacuum environments (e.g. those which do not suffer from outgassing). Another advantage is that the sensors 121, 122 can be accessed (e.g. for maintenance or otherwise) without having to bring the chamber 110 up to atmospheric pressure. In an alternative embodiment one or more of the sensors 121, 122 may be disposed inside the chamber 110.

Each of the two sensors 121, 122 may be provided with filtering optics that are arranged to filter out one or more bands of radiation. The filtering optics may comprise transmissive optics, which are arranged to absorb the one or more bands of radiation that are to be filtered out and transmits other bands of radiation. Additionally or alternatively, the filtering optics may comprise reflective optics, which are arranged to absorb the one or more bands of radiation that are to be filtered out and reflects other bands of radiation. Such reflective filtering optics may comprise a mirror provided with a (e.g. dielectric) coating that transmits the one or more bands of radiation that are to be filtered out and reflects other bands of radiation.

For example, each of the two sensors 121, 122 may be provided with filtering optics that are arranged to filter out radiation with a wavelength equal to, or similar to, that of the radiation beam 102. This may be advantageous since the two sensors 121, 122 may be subject to stray radiation from the radiation beam 102, which may from a significant background to the signal. Note that since all matter absorbs EUV radiation well, for embodiments wherein radiation beam 102 comprises EUV radiation the first and second windows 151, 152 may filter out EUV radiation. Therefore, additional filtering optics may not be provided for such embodiments.

Additionally or alternatively, one or more filtering optics may be provided to reduce the amount of radiation from one or more bands of radiation that is received by the one or more of the sensors 121, 122. In one embodiment, the first and second windows 151, 152 may be formed from a material which absorbs one or more bands of radiation (e.g. EUV radiation) or, alternatively, may be provided with a coating formed from such a material.

As explained above, there may be several processes which result in the emission of secondary radiation from the interaction region 111. Each process may, in general, result in a different spectrum of secondary radiation (e.g. different emission lines). Some of the processes may result in secondary radiation whose intensity is more directly correlated with the intensity distribution of radiation beam 102 than others. Therefore there may be some advantage in providing each of the two sensors 121, 122 with filtering optics that are arranged to filter out one or more bands of radiation so as to leave the bands of radiation which are most strongly and/or more accurately correlated with the intensity distribution of radiation beam 102.

The two sensors 121, 122 are arranged to receive and detect radiation emitted from the interaction region 111 of the chamber 110 in two different directions. This allows a two-dimensional position of the radiation beam 102 to be determined. In particular, the two sensors 121, 122 are arranged to receive and detect radiation emitted from the region of the chamber around the axis in two generally perpendicular directions. In alternative embodiments the two different directions are not perpendicular to each other. Each of the sensors 121, 122 has a pointing direction which is parallel to the general direction of secondary radiation from the interaction region 111 that that sensor 121, 122 receives. That is, if each sensor 121, 122 can be considered to be a camera which forms an image of the interaction region 111, the pointing direction of each sensor 121, 122 is the direction that the camera is pointing in. Each of the sensors 121, 122 is disposed such that its pointing direction is generally perpendicular to the axis 104. For example, as shown in FIG. 4, sensor 121 is disposed such that it is pointing in a direction generally parallel to the x axis and sensor 122 is disposed such that it is pointing in a direction generally parallel to the y axis.

Each of the sensors 121, 122 allows a position of the radiation beam to be determined in a direction which lies in a plane perpendicular to the central axis 104. This direction may be referred to as the sensing direction of that sensor 121, 122. The sensing direction of a sensor is generally perpendicular the direction of the secondary radiation from the interaction region 111 that the sensor receives.

Each of the two sensors 121, 122 is provided with focusing optics 161, 162 that are arranged to focus secondary radiation emitted from the interaction region 111 onto a plane parallel to the axis 104, which may be referred to as its image plane. In one embodiment, the focusing optics 161, 162 of each sensor 121, 122 comprises a focusing lens, which is disposed between its window 151, 152 and the sensor 121, 122. Each focusing optics 161, 162 forms an image of the interaction region 111, that image being a projection of the radiation emitted from the interaction region 111 onto the image plane of one of the sensors 121, 122. The image plane of each sensor is perpendicular to its pointing direction and parallel to its sensing direction. For example, sensor 121 receives a projection of the interaction region 111 onto the y-z plane and sensor 122 receives a projection of the interaction region 111 onto the x-z plane. Therefore, each of the two sensors 121, 122 is arranged to determine a position of the radiation beam in a different sensing direction in a plane perpendicular to the axis 104 (i.e. the x-y plane of FIGS. 4 and 5). Sensor 121 is arranged to determine a position of the radiation beam in the y direction and sensor 122 is arranged to determine a position of the radiation beam in the x direction.

Each sensor 121, 122 is operable to output a signal 121a, 122a which is indicative of the position of the radiation beam 102 in its sensing direction (which is perpendicular to its pointing direction). The signals 121a, 122a output by sensors 121, 122 are received by processor 125. The processor 125 is operable to use radiation detected by the two sensors 121, 122 to determine a position and/or power of radiation beam 102 propagating through the chamber 110 generally along the axis 104.

Although radiation sensor apparatus 100 comprises a single processor 125, in alternative embodiments, each sensor 121, 122 may be provided with a separate processor. For such embodiments, each processor may be separate from or integrated with its corresponding sensor 121, 122. It will be appreciated that the term processor is intended to cover anything which is operable to process the data received by sensors 121, 122. The processor 125 may comprise a microprocessor.

Various arrangements which may form either or both of the two sensors 121, 122 are now described. In the following, for convenience, only one sensor will be described in detail. The example sensors will be described as if disposed in the position of sensor 121 in FIGS. 4 and 5. It will be appreciated that the sensor disposed in the position of sensor 122 in FIGS. 4 and 5 may also comprise any of the following arrangements.

Each sensor 121, 122 may comprise a plurality of sensing elements which are sensitive to radiation from the interaction region 111.

Figure 6:
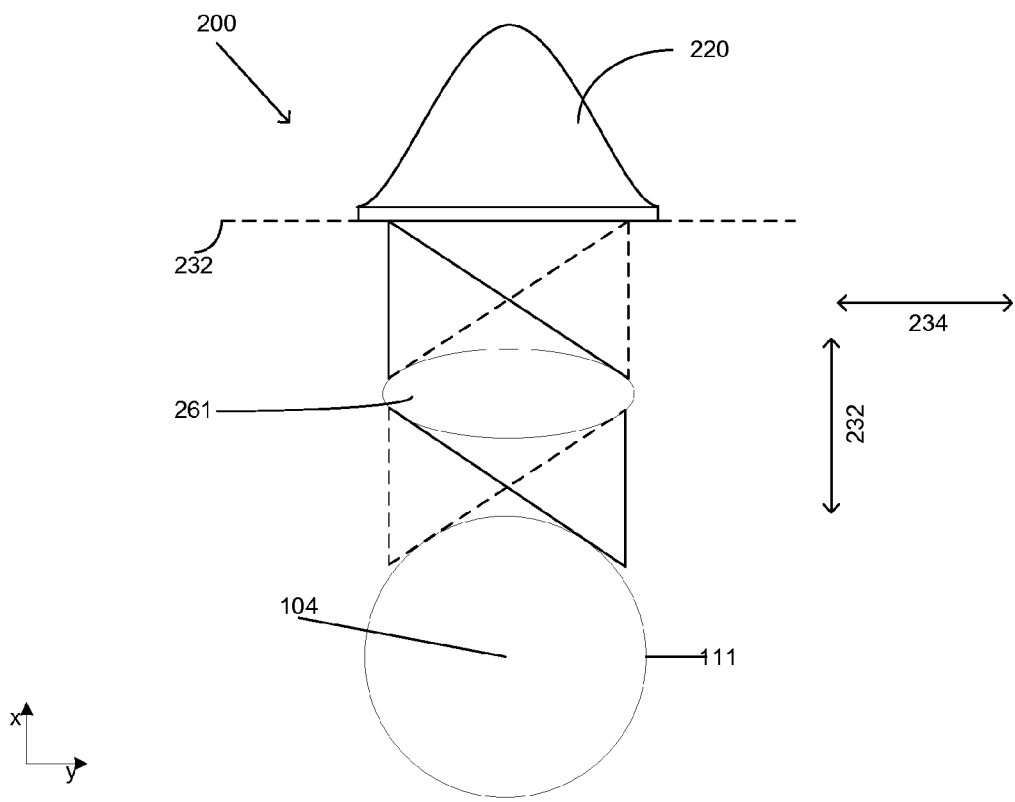
FIG. 6 is a schematic illustration of an embodiment of a sensor and focusing optic which may form part of the radiation sensor apparatus of FIG. 5.

FIG. 6 shows a sensor 200, which comprises a plurality of sensing elements which are sensitive to radiation from the interaction region 111. For simplicity, the beam pipe 105, chamber 110 and window 151 have been omitted from FIG. 6.

A focusing lens 261 forms an image 211 of the interaction region 111 in an image plane 230, where the sensor 200 is located. Focusing lens 261 may comprise a generally spherical lens or, alternatively, a generally cylindrical lens. The sensor 200 is disposed in the image plane 230 and is arranged to receive and detect radiation emitted from the interaction region 111.

Since the emission of secondary radiation from the interaction region 111 is dependent upon the intensity distribution of the radiation beam 102, the sensor 200 will receive a signal 220 which is related to the intensity distribution of the radiation beam 102. As explained above, the image 211 formed in the image plane 230 of the sensor 200 is a projection of the three-dimensional intensity distribution of secondary radiation emission within the interaction region 111 onto the image plane 230. The sensor 200 effectively integrates this three-dimensional intensity distribution over the pointing direction 232 of the sensor 200. For example, if the radiation beam 102 has a Gaussian intensity distribution, then in a plane perpendicular to central axis 104 (i.e. the x-y plane) the three-dimensional intensity of secondary radiation emitted from the interaction region may be a two-dimensional Gaussian function. The sensor 200 will image a projection of a two-dimensional Gaussian function onto a plane.

The position of the radiation beam 102 may be determined from the image formed in the image plane 230 of sensor 200. The sensor 200 allows a position of the radiation beam 102 to be determined in a sensing direction 234.

Figure 7:
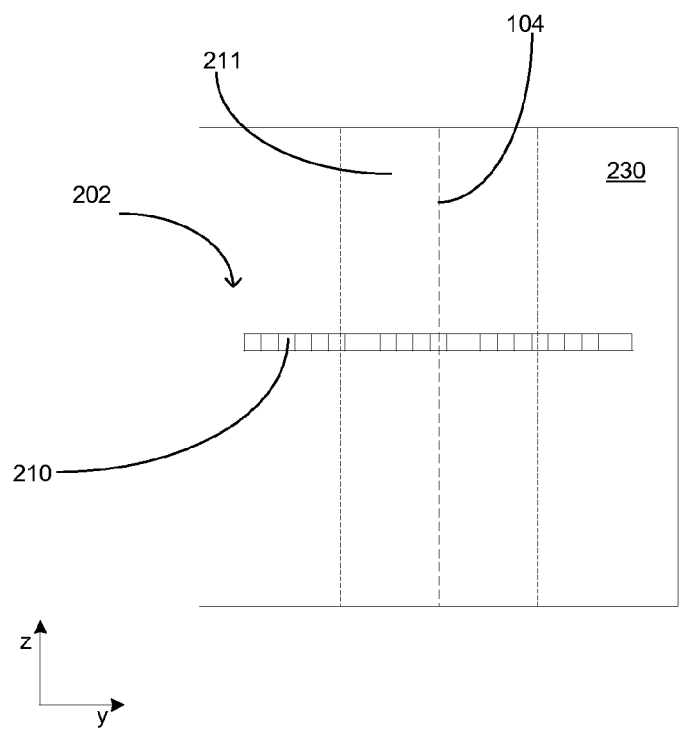
FIG. 7 is a schematic illustration of the sensor of FIG. 6 in a first orientation in its image plane.
Figure 8:
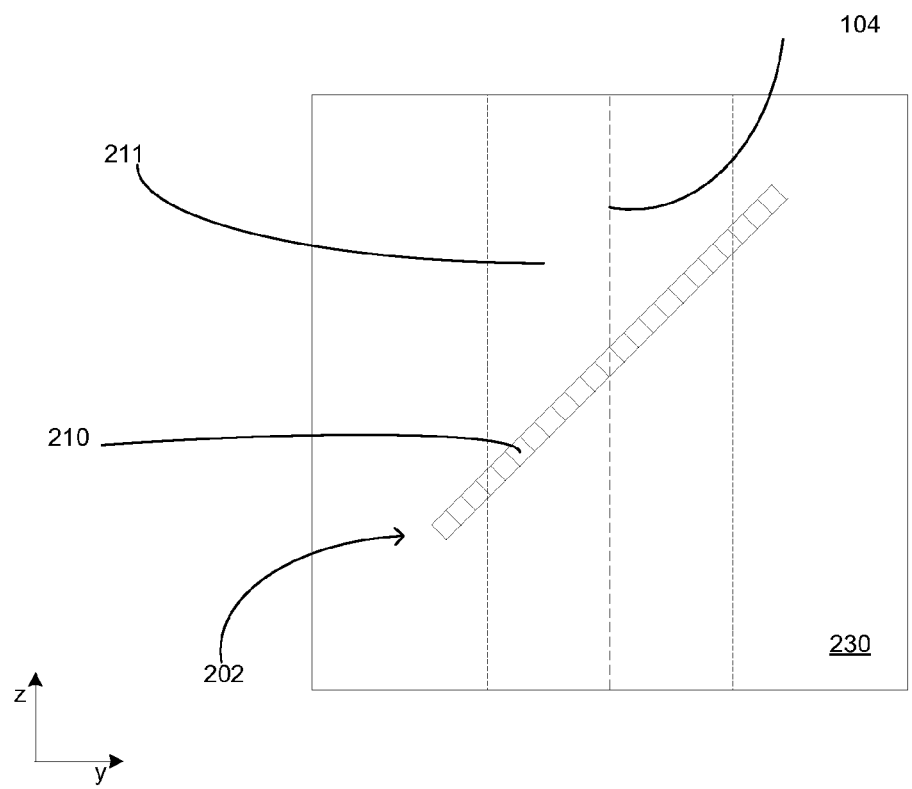
FIG. 8 is a schematic illustration of the sensor of FIG. 6 in a second orientation in its image plane.

In a first arrangement, as shown in FIGS. 7 and 8, sensor 200 comprises a one-dimensional array 202 of sensing elements 210 which are each sensitive to radiation from the interaction region. For example, the one-dimensional array 202 of sensing elements 210 may comprise a charged coupled device (CCD) array.

For this arrangement, the determined position of the laser beam 102 may be the centroid (or centre of mass) of the image of the secondary radiation that is formed in the image plane 230. Alternatively, if the intensity distribution of the radiation beam 102 is known then shape of the signal 220 produced by the array 202 can be predicted and the position of the radiation beam 102 may be determined, for example, by fitting a curve to the data measured by the sensing array 202. This may be achieved, for example, using a least squares fit or other suitable fitting procedure. However, the fitting procedure may be relatively computationally intense and therefore embodiments which use such a procedure may have a longer response time. The response time of a radiation sensor apparatus may be the time taken to output a characteristic (e.g. the position or power of radiation beam 102) after a change in one or more properties of the radiation beam 102. Further, the response rate of a radiation sensor apparatus may be the inverse of the response time of that radiation sensor apparatus.

As shown in FIG. 7, the sensing array 202 may be arranged such that it extends in a direction which is perpendicular to the central axis 104 (i.e. the z-direction). That is, the sensing array 202 may extend along the sensing direction of the array 202 (i.e. the y-direction).

Alternatively, as shown in FIG. 8, the sensing array 202 may be arranged such that it extends in a direction which forms an oblique angle with the central axis 104 (i.e. the sensing direction of the array 200). That is, the axis 203 of the one-dimensional array 202 may be disposed an oblique angle to the sensing direction (i.e. the y-direction) of the sensor 200. In the example shown, the sensing array 210 extends at an angle of around 45° to the z-direction. Placing the array 202 such that its axis 203 is disposed at an oblique angle to the sensing direction 234 of the sensor 200 allows the use of an array 200 with larger sensing elements 210. Advantageously, this results in a sensor 200 with higher sensitivity. Additionally or alternatively, it allows the use of an array 202 with a greater number of sensing elements 210, which results in a sensor 200 with a higher effective resolution.

Figure 9:
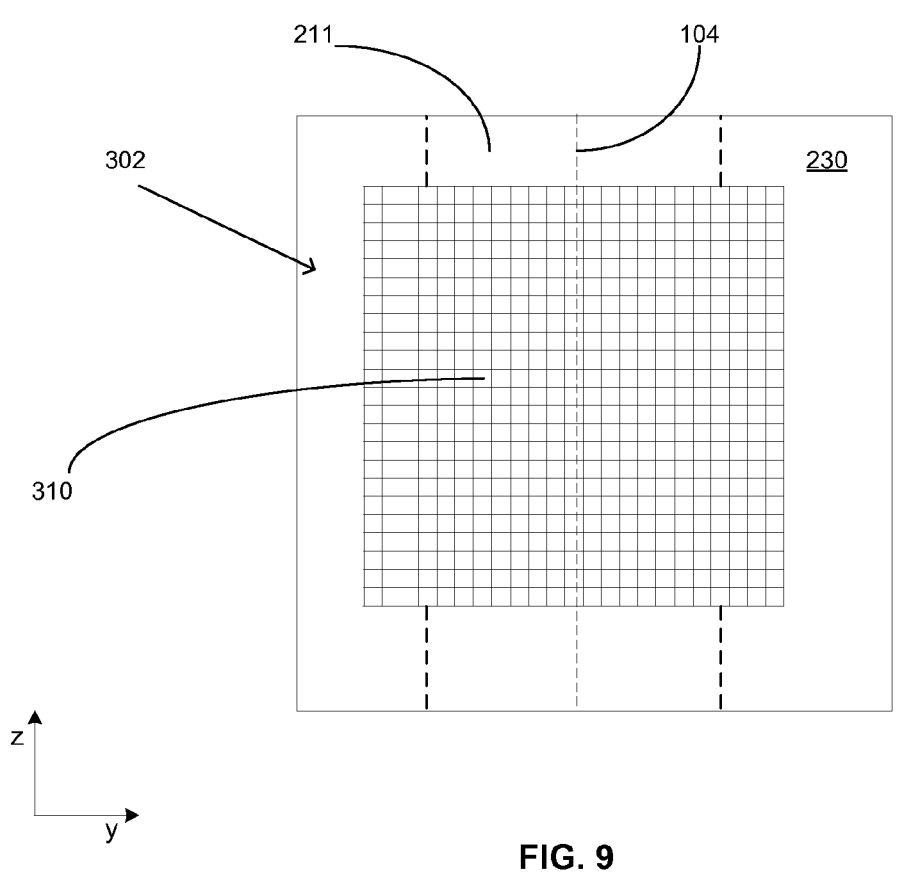
FIG. 9 is a schematic illustration of another embodiment of a sensor and focusing optic which may form part of the radiation sensor apparatus of FIG. 5.

In a second arrangement, as shown in FIG. 9, sensor 200 comprises a two-dimensional array 302 of sensing elements 310 which are each sensitive to radiation from the interaction region. For example, the two-dimensional array 302 of sensing elements 310 may comprise a CCD array.

The use of a two-dimensional array 302 results in a larger detection area than, for example, the one-dimensional array 202 shown in FIGS. 7 and 8. Advantageously, this results in an increase in signal-to-noise ratio. However, readout and data processing may be slower for embodiments using a two-dimensional array 302 in comparison to embodiments using a one-dimensional array 202.

Figure 10:
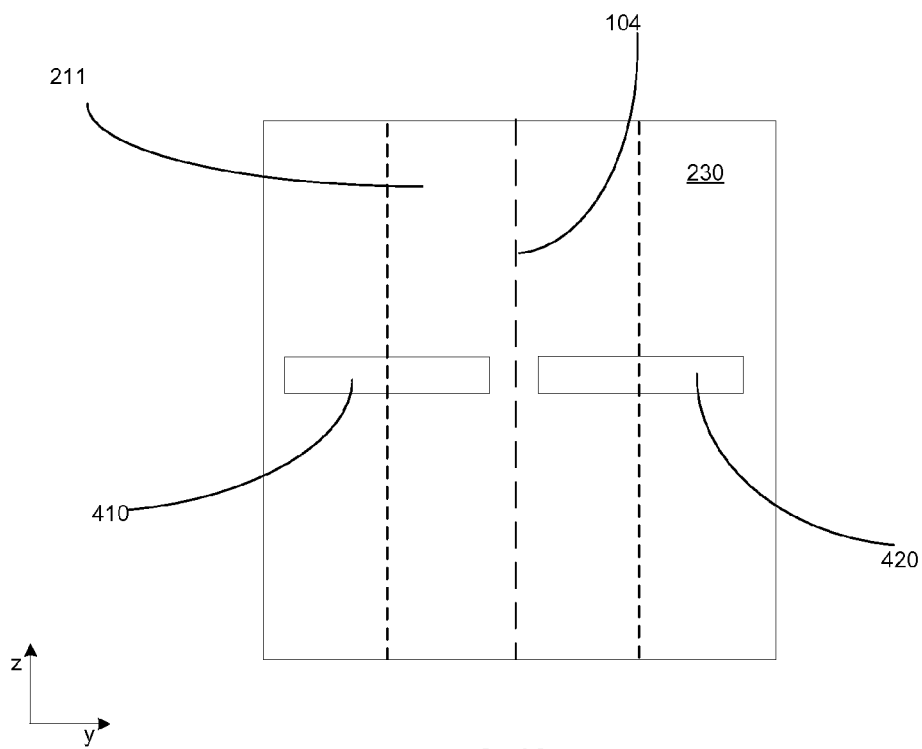
FIG. 10 and FIG. 10A are schematic illustrations of another embodiment of a sensor and focusing optic which may form part of the radiation sensor apparatus of FIG. 5.

In a third arrangement, as shown in FIG. 10, sensor 200 comprises two sensing elements 410, 420 separated in the sensing direction 234 of sensor 200. For example, each of the sensing elements 410, 420 may comprise a photodiode.

For such embodiments, the processor 125 may determine the position of the radiation beam 102 in a sensing direction 234 of sensor 200 to be the median of the intensity profile of the radiation beam 102. For example, the processor 125 may determine the position of the radiation beam 102 in a sensing direction 234 of sensor 200 (as measured from the mid-point of the two sensing elements 410, 420) to be dependent upon the difference in the signals from the two sensing elements 410, 420.

Each of the two sensing elements 410, 420 may receive signal s1, s2 respectively. If signals s1, s2 are approximately equal in magnitude, then the position of the radiation beam 102 in the sensing direction 234 (as measured from the mid-point of the two sensing elements 410, 420) may be proportional to $(s1-s2)/(s1+s2)$. This uses a linear approximation, neglecting terms of the order of $(s1-s2)^2$ and higher (Note that for a radiation beam 102 with an axially symmetric intensity distribution, such as a Gaussian-like distribution, the order $(s1-s2)^2$ terms vanish and the approximation only neglects terms of the order of $(s1-s2)^3$ or higher). For this embodiment, in order to determine an absolute position of the radiation beam 102 the constant of proportionality may be required to calibrate the sensor 200. This may require prior knowledge of the profile (intensity distribution) of the radiation beam 102.

An advantage of this embodiment (which uses two sensing elements 410, 420) is that it is very fast, with a very small response time, compared, for example, to arrangements wherein each sensor comprises an array of sensing elements. For example, this embodiment may be suitable for use at a response rate of the order of 1 MHz. In order to determine an absolute position of the radiation beam 102, prior knowledge of the profile (intensity distribution) of the radiation beam 102 may be required. Therefore, the embodiment of FIG. 10 may be particularly suitable for monitoring fluctuations in the position of the radiation beam 102.

Figure 10A:
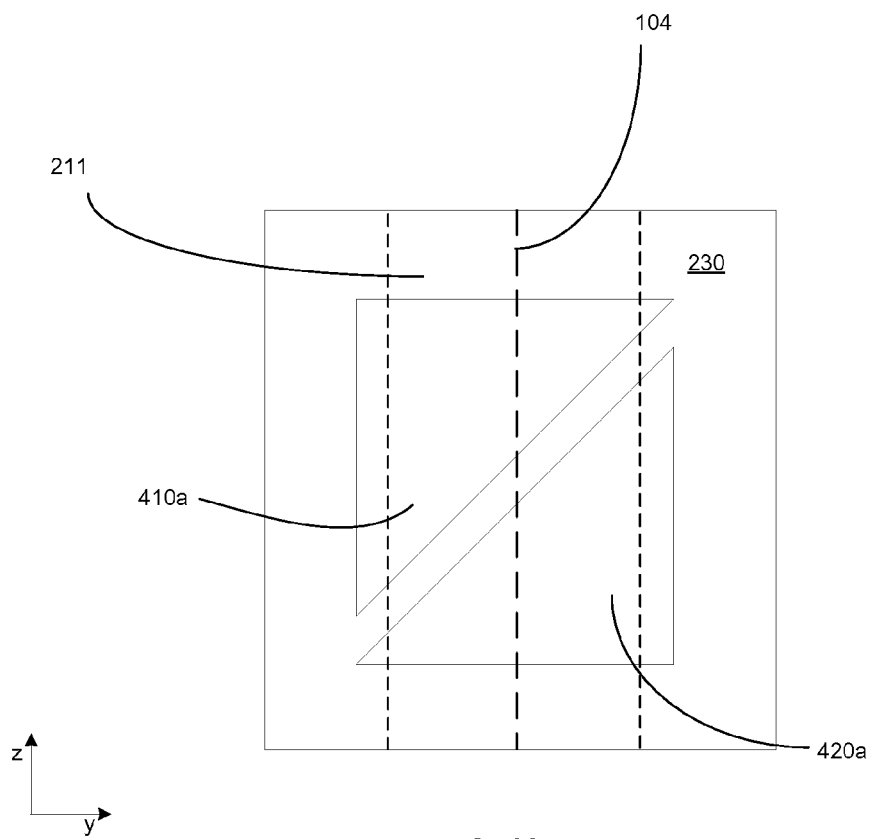

In a fourth arrangement, as shown in FIG. 10A, sensor 200 comprises two sensing elements 410a, 420a. The fourth arrangement (shown in FIG. 10A) is a variation of the third arrangement (shown in FIG. 10). Each of the sensing elements 410a, 420a may for example comprise a photodiode. The two sensing elements 410a and 420a each have the shape of a right triangle. The two right triangles are such that the two sensing elements 410a, 420a span the same range in the the sensing direction (i.e. the y-direction) of the sensor 200. The two right triangles may be such that the two sensing elements 410a, 420a are offset relative to each other in the z direction.

For such embodiments, the processor 125 may determine the position of the radiation beam 102 in a sensing direction 234 of sensor 200 to be the mean of the intensity profile of the radiation beam 102. For example, the processor 125 may determine the position of the radiation beam 102 in a sensing direction 234 of sensor 200 (as measured from the mid-point of the two sensing elements 410a, 420a) to be dependent upon the difference in the signals from the two sensing elements 410a, 420a.

As with the third embodiment, each of the two sensing elements 410a, 420a may receive signal s1, s2 respectively. The position of the radiation beam 102 in the sensing direction 234 (as measured from the mid-point of the two sensing elements 410, 420) may be proportional to $(s1-s2)/(s1+s2)$. Again, in order to determine an absolute position of the radiation beam 102 the constant of proportionality may be required to calibrate the sensor 200. For this embodiment, the proportionality constant depends on the geometry of the triangular shapes of sensing elements 410a, 410b and the focusing optics. However, the proportionality constant is independent of the intensity profile of the radiation beam 102.

As with the embodiment shown in FIG. 10, the embodiment shown in FIG. 10A is very fast, with a very small response time, compared, for example, to arrangements wherein each sensor comprises an array of sensing elements. For example, this embodiment may be suitable for use at a response rate of the order of 1 MHz. Advantageously, the embodiment shown in FIG. 10A does not require prior knowledge of the profile (intensity distribution) of the radiation beam 102 in order to determine an absolute position of the radiation beam 102.

Figure 11:
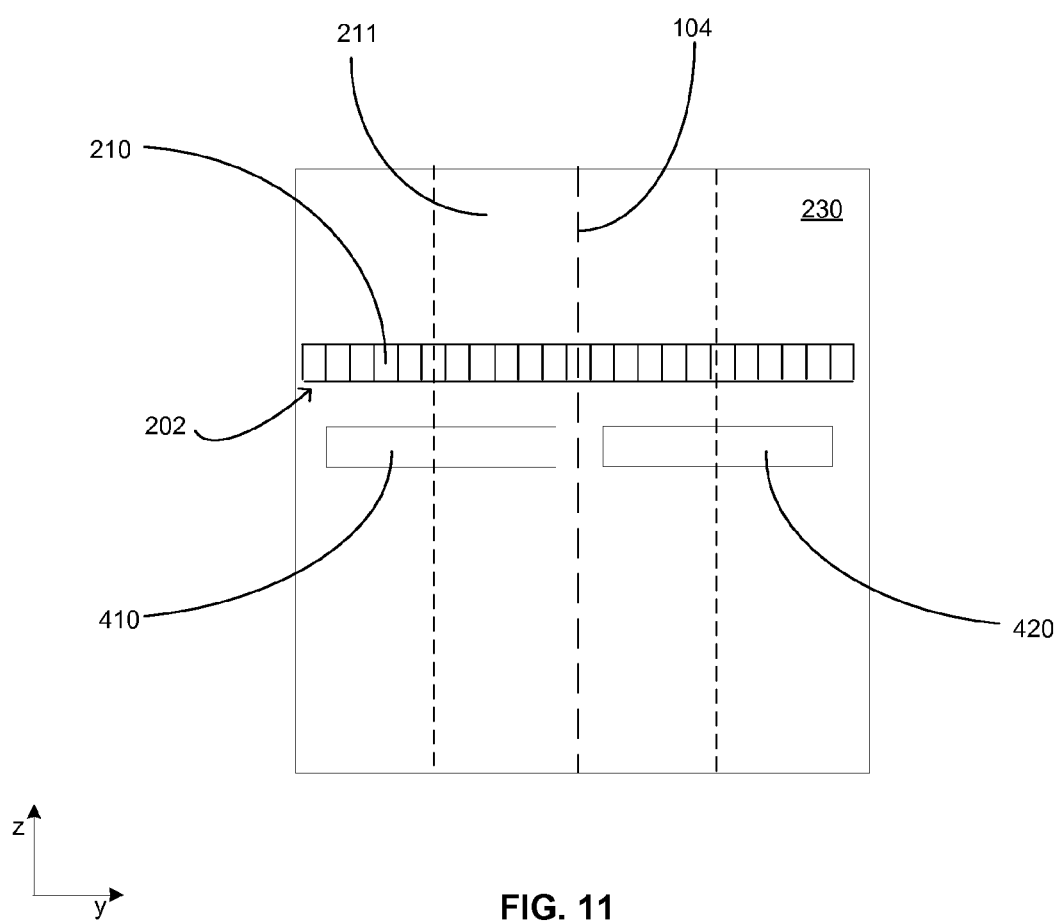
FIG. 11 is a schematic illustration of another embodiment of a sensor and focusing optic which may form part of the radiation sensor apparatus of FIG. 5.
Figure 12:
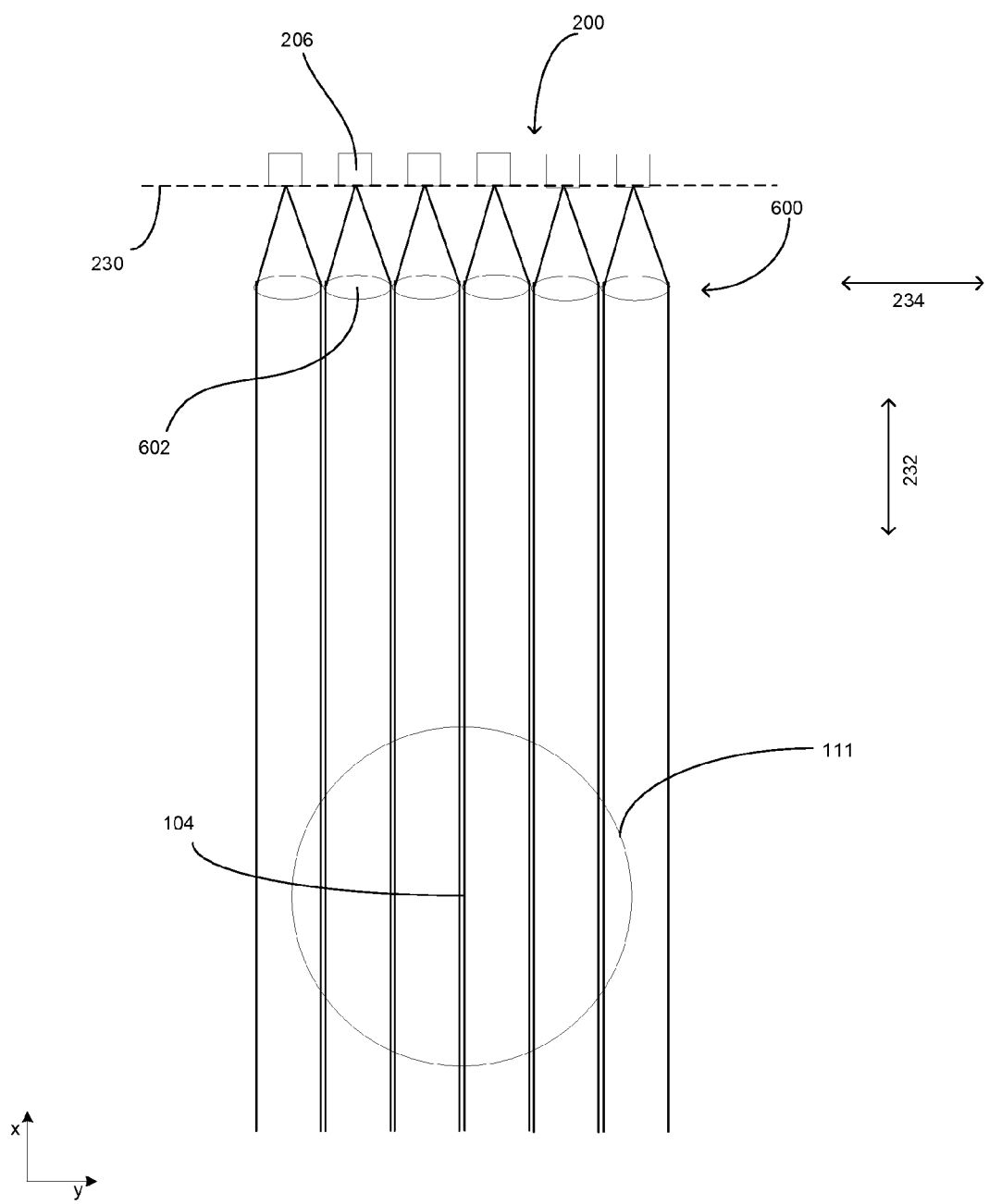
FIG. 12 is a schematic illustration of another embodiment of a sensor and focusing optic which may form part of the radiation sensor apparatus of FIG. 5.

In a fifth embodiment, as shown in FIG. 11, sensor 200 is a combination of the sensors shown in FIGS. 7 and 10, which combines the advantages of these two embodiments. In the embodiment shown in FIG. 11, sensor 200 comprises a one-dimensional array 202 (substantially as described above in relation to FIGS. 7 and 8) and two sensing elements 410, 420 (substantially as described above in relation to FIG. 10).

The two parts of this composite sensor 200 may provide an indication of the position of the radiation beam 102 at two different response rates. The array 202 may be used to provide a signal at a response rate of the order of 1 kHz and the two sensing elements 410, 420 may provide a signal at a response rate of the order of 1 MHz. The signal from the array 202 may be used to calibrate the signal from the two sensing elements 410, 420 such that the two sensing elements 410, 420 can be used to determine an absolute position of the radiation beam 102.

Note that in all of the described embodiments which comprise arrays of sensing elements (e.g. CCD arrays) may comprise any number of sensing elements. In this regard, the sensing arrays 202, 302 depicted in the accompanying Figures are for illustrative purposes only.

The configuration shown in FIG. 6 uses a single focusing lens 261 to form an image 211 of the interaction region 111 in an image plane 230 of the sensor 200. However, if the diameter of the interaction region 111 is not negligible compared to the distance between the interaction region 111 and the focusing lens 261, this arrangement of one focusing lens may be sensitive to parallax errors.

An alternative focusing optic 600 which may be used for sensor 200 (and any of the embodiments thereof described above) is shown in FIG. 12. The focusing optic 600 comprises an array of focusing lenses 602, each of which is arranged to form an image of a different part of the interaction region 111 in the image plane 230 of the sensor 200. The array of focusing lenses 602 is such that the focusing lenses 602 are located at a range of different locations in the sensing direction 234 (i.e. the y-direction in FIG. 12). The array of focusing lenses 602 may comprise a one-dimensional array of cylindrical lenses. Alternatively, the array of focusing lenses 602 may comprise a two-dimensional array of spherical lenses. For such embodiments (comprising a two-dimensional array of spherical lenses), each of the individual focusing lenses 602 may comprise a micro-lens. A micro-lens may be a lens with a diameter less than 1 mm.

Such a focusing optic 600, comprising an array of focusing lenses 602, is less sensitive to parallax errors, especially for embodiments wherein a diameter of the interaction region is not negligible in comparison to a distance between the interaction region and the focusing optics. For embodiments wherein focusing optic 600 comprises an array of focusing lenses 602, sensor 200 may comprise an array of individual sensors 206.

In addition to, or an alternative to, determining a position of radiation beam 102, one or more sensors 121, 122 of radiation sensor apparatus 100 may be used to determine a power of the radiation beam 102. The power of the radiation beam 102 may, for example, be proportional to the total amount of secondary radiation received by each of the one or more sensors 121, 122.

Although the chamber 110 of radiation sensor apparatus 100 is provided with a pump 116 such a pump is not essential and therefore some alternative embodiments may have no pump. The pump 116 may decrease the time constant for changes in pressure within the chamber 110. A pump 116 may be especially useful for embodiments with larger chambers 110 and smaller first and second openings 107a, 108a. A pump 116 may also be especially useful for embodiments wherein a first species of gas is provided in the chamber 110 and a second, different species of gas is present within the beam pipe 105. For such embodiments the pump reduces ingress of the second species of gas into the chamber 110 from the beam pipe 105. Therefore the pump reduces any effect that the second species of gas may have on the radiation sensor apparatus 100. For embodiments wherein the gas provided in the chamber 110 is also present within the beam pipe 105 (for example wherein hydrogen gas is present within beam pipe 105 and the chamber 110) the pump 116 may be omitted.

Radiation sensor apparatus 100 described above comprises two sensors 121, 122, each of which is arranged to receive and detect radiation emitted from the interaction region 111 of the chamber 110 in a different direction. This allows a two-dimensional position of the radiation beam 102 to be determined. However, in alternative embodiments a different number of sensors may be provided. For example, in one alternative embodiment the radiation sensor apparatus comprises a single sensor, which may allow a one-dimensional position of the radiation beam 102 to be determined. Alternatively, the radiation sensor apparatus comprises more than two sensors, which may allow more data on the intensity profile to be obtained (in comparison to embodiments comprising one or two sensors). For example, if the radiation beam 102 is elliptical in cross section then more than two sensors may allow to additional information regarding the ellipticity and/or orientation of the radiation beam 102 to be determined. In general, the radiation sensor apparatus comprises one or more sensors, each arranged to receive and detect radiation emitted from a region 111 of the chamber 110 around the central axis 104.

Figure 13:
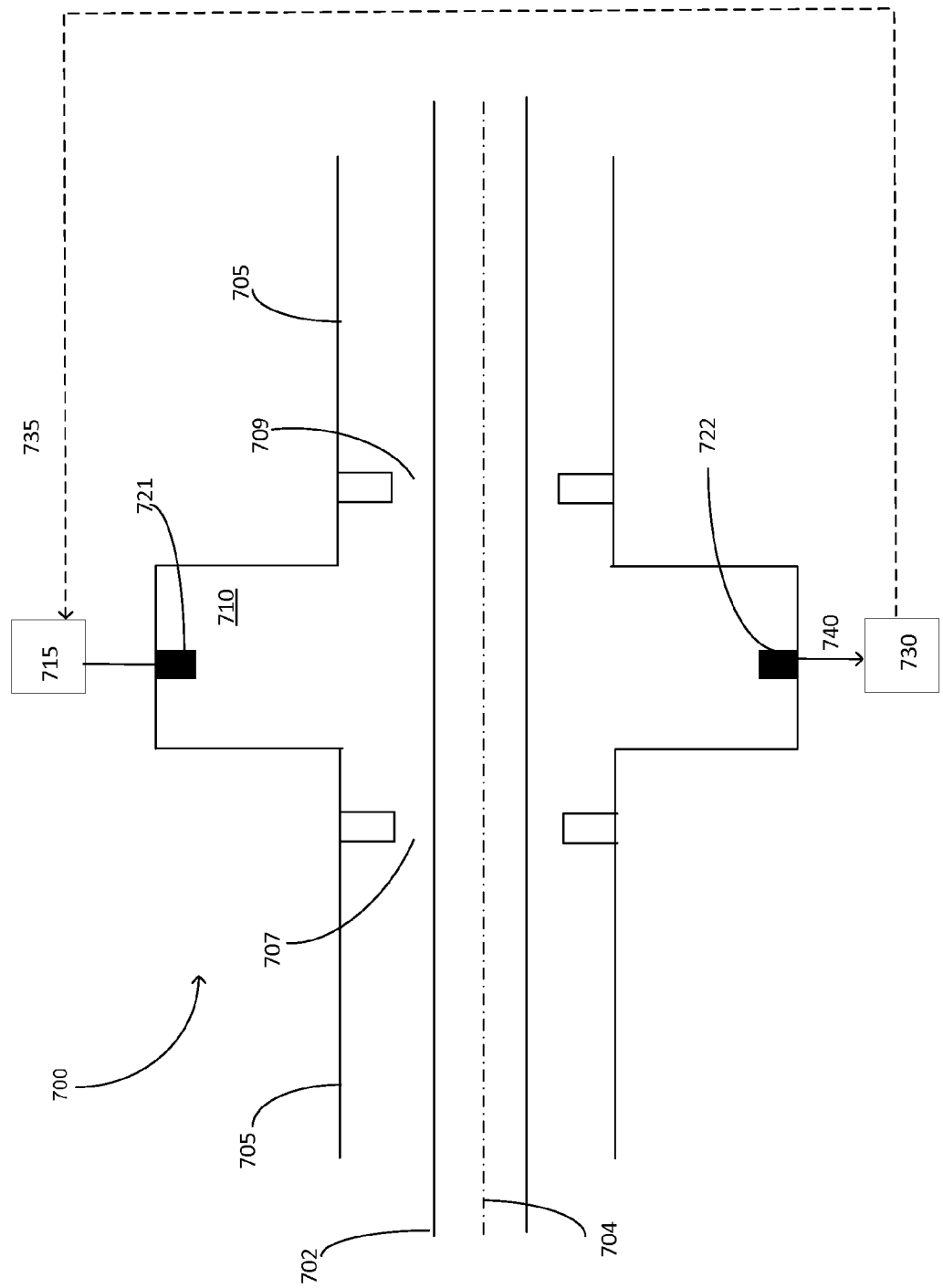
FIG. 13 is a schematic illustration of a first embodiment of a second type of radiation sensor apparatus which may form part of the lithographic system of FIG. 1 in cross section in a plane perpendicular to its axis.

An embodiment of a second type of radiation sensor apparatus which is suitable for use in a lithographic system LS is now described with reference to FIG. 13, which is a schematic illustration of a radiation sensor apparatus 700 which is suitable for use in a lithographic system LS. The radiation sensor apparatus 700 is configured to measure the power of a radiation beam 702, as now described. Radiation sensor apparatus RS of FIG. 1 may for example comprise radiation sensor apparatus 700.

Radiation sensor apparatus 700 is based on microwave cavity resonance spectroscopy (MCRS). Radiation sensor apparatus 700 comprises a resonant cavity 710, a first antenna 721, a second antenna 722 and a processor 730.

The resonant cavity 710 is generally cylindrical although it will be appreciated that other shapes may alternatively be used. The resonant cavity 710 is provided with a first opening 707 and a second opening 709. The first and second openings 707, 709 are provided on opposite sides of the resonant cavity 710, at opposite ends of the resonant cavity 710, such that an axis of the cylindrical resonant cavity 710 extends between the first and second openings 707, 709.

The resonant cavity may form part of a pipe 705 for a radiation beam 702. For example, a first section of beam pipe 705 may communicate with the resonant cavity via the first opening 707 and a second section of beam pipe 705 may communicate with the resonant cavity 710 via the second opening 709. In use, a radiation beam 702 propagating along pipe 705 enters the resonant cavity 710 through the first opening 107, propagates through the resonant cavity 710 generally along axis 704, and exits the resonant cavity 710 through the second opening 109.

The radiation beam 702 may for example comprise EUV radiation. Since EUV radiation is generally well absorbed by matter, for such embodiments, the pipe 705 may be under vacuum conditions so as to minimise attenuation of the radiation beam 702 due to absorption. In optical systems, for example lithographic systems, using EUV radiation reflective optical elements may be used in preference to transmissive optical elements. Further, it is known to provide hydrogen gas in the vicinity of such reflective optical elements since in the presence of EUV radiation such hydrogen gas may have a cleaning effect on optical surfaces. For example, the hydrogen gas may be provided at pressures below atmospheric pressure, for example below 100 Pa, for example below 5 Pa.

The first and second antennae 721, 722 are provided on a curved wall of the cylindrical cavity 710, on opposite sides of the resonant cavity 710. In this embodiment, the first and second antennae 721, 722 both extend into the resonant cavity 710 from the curved wall and are therefore disposed within the resonant cavity 710. Alternatively, either or both of the first and second antennae 721, 722 may be disposed outside of the resonant cavity 710 and may be coupled to the resonant cavity 710, for example by a waveguide.

The first antenna 721 is provided with a power supply 715. Together, the first antenna 721 and power supply 715 form a source that is operable to excite an electromagnetic wave within the resonant cavity 710. In particular, the first antenna 721 and power supply 715 are operable to excite a resonant mode of the resonant cavity 710, which may comprise an electromagnetic standing wave. The power supply 715 may comprise a radiofrequency (RF) source, which, in combination with the first antenna 721, may be operable to excite electromagnetic waves within the resonant cavity 721 with a frequency of the order of 1-10 GHz.

The second antenna 722 forms a receiver that is operable to monitor the electromagnetic wave within the resonant cavity 710. In particular, the second antenna 722 is operable to monitor an amplitude of the electromagnetic wave within the resonant cavity 710 and to output a signal 740 indicative of the amplitude to the processor 730. The electromagnetic wave within the resonant cavity 710 will oscillate at the frequency at which the first antenna 721 is driven by power supply 715. Therefore, the signal 740 output by the second antenna 722 will oscillate at this frequency. The overall amplitude of this oscillating signal 740 may be indicative of the amplitude of the electromagnetic wave that is received by the second antenna 722.

The processor 730 is operable to measure a resonant frequency of the resonant cavity 710. The processor 730 is arranged to receive the signal 740 output by the second antenna 722. The processor 730 is operable to control the power supply 715 so as to control the frequency of the electromagnetic wave that is exited within the resonant cavity 710 by the first antenna 721. For example, the processor 730 may be operable to send a control signal 735 to the power supply 715. In turn, the frequency supplied to the first antenna 721 by power supply 715 may be chosen in dependence on the control signal 735. The control signal 735 may be an oscillating signal, for example a sinusoidal signal that oscillates at a frequency that it is desired for the power supply 715 to operate at. The power supply 715 may be operable to excite an electromagnetic standing wave in the resonant cavity 710 which has a frequency equal to that of the control signal 735. In this way, by controlling the frequency of the control signal 735 the frequency of the electromagnetic standing wave within the resonant cavity 710 may be controlled.

In one embodiment, in order to determine a resonant frequency of the resonant cavity 710, the processor 730 may be operable to control the power supply 715 so as to vary the frequency of the electromagnetic wave that is exited within the resonant cavity 710 and to simultaneously monitor the amplitude of the electromagnetic wave within the resonant cavity 710. The processor 730 may determine the resonant frequency of the resonant cavity 710 to be a frequency at which a local maximum occurs in the amplitude of the electromagnetic wave within the resonant cavity 710.

In another embodiment, in order to determine a resonant frequency of the resonant cavity 710, the processor 730 may be operable to determine a relative phase between: (i) the control signal 735 that is sent by the processor 730 to the power supply 715; and (ii) the signal 740 output by the second antenna 722, as now described.

Figure 14:
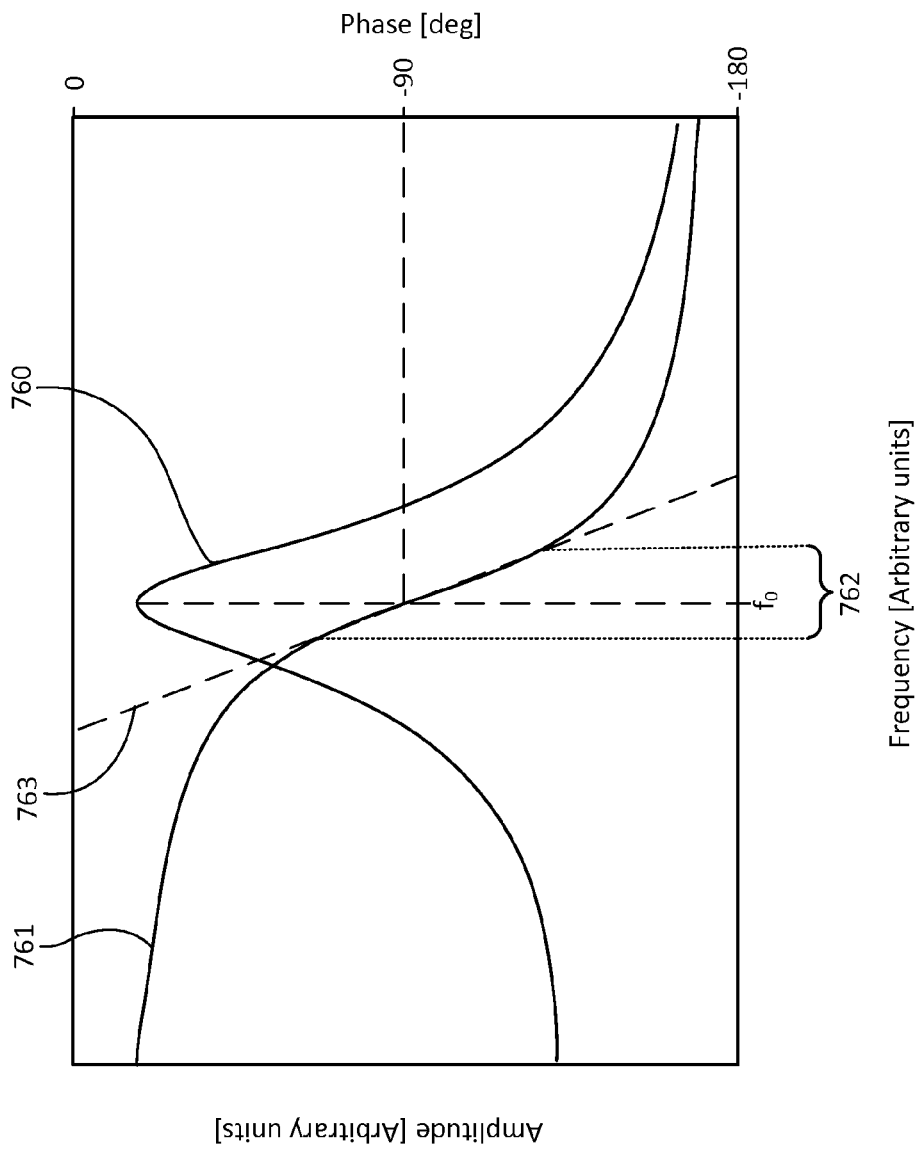
FIG. 14 shows a plot of the amplitude and relative phase lag (relative to a driving force) of response for a damped driven harmonic oscillator.

FIG. 14 shows the amplitude 760 of response for a damped driven harmonic oscillator (such as, for example, a resonant cavity 710) as a function of driving frequency. Also shown is the relative phase 761 of response for the damped driven harmonic oscillator (relative to the driving signal), as a function of driving frequency. As can be seen from FIG. 14, at the resonant frequency $f_0$ of the system the amplitude 760 of the system is at a maximum and the relative phase 761 is $-90°$ (i.e. the response of the system lags behind the driving signal by 90°). At frequencies below the resonant frequency $f_0$ of the system, the phase lag is reduced, with the relative phase tending towards 0° for frequencies well below resonance. At frequencies above the resonant frequency $f_0$ of the system, the phase lag is increases, with the relative phase tending towards 180° for frequencies well above resonance. Although the relative phase is a non-linear function of the driving frequency, there is a range of frequencies 762 for which the relationship between the relative phase and the driving frequency may be approximated by a linear relationship, as represented by line 763.

The processor 730 may be operable to determine a relative phase between: (i) the control signal 735 that is sent by the processor 730 to the power supply 715; and (ii) the signal 740 output by the second antenna 722. From this relative phase, the processor 730 may be further operable to determine the resonant frequency of the resonant cavity 710 in dependence on the determined relative phase. This may be achieved using a known, or previously determined relationship between the relative phase between the control signal 735 and signal 740. Such a relationship may be generally of the form of the relative phase 761 as illustrated in FIG. 14. For sufficiently small variations from the resonant frequency $f_0$ of the system the relationship may be linear.

In order to determine the relative phase between control signal 735 and signal 740, the processor 730 may comprise a phase detector (also known as a phase comparator). The phase detector may be analogue or digital. Although in this embodiment, the phase detector forms part of the processor 730, it will be apparent to the skilled person that in alternative embodiments, the phase detector may be separate from, and in communication with, the processor 730.

The resonant cavity 710 is suitable for containing a gas. In use, a gas with well-defined composition and density is provided in the resonant cavity 710. A gas (for example hydrogen) may pass into the resonant cavity 710 from the pipe 705. Alternatively, radiation sensor apparatus 700 may be provided with a gas supply (not shown), which is operable to introduce gas into the resonant cavity 710. A pressure sensor may be arranged to measure the pressure inside the resonant cavity 710. The resonant cavity 710 may be further provided with a pump (not shown) which is configured to pump gas out of the resonant cavity 710. The pump may be operable to adjust the rate at which gas is pumped out of the resonant cavity 710.

For embodiments wherein the resonant cavity 710 is provided with a gas supply, a pump and/or a pressure sensor, one or more apertures may be provided in the resonant cavity 710 to connect each of the gas supply, pump and pressure sensor to the resonant cavity 710. These apertures should be smaller than the wavelength of the standing wave within the resonant cavity 710 to reduce losses through the apertures. For a frequency of 3.5 GHz any apertures in the resonant cavity 710 should be smaller than 8.6 cm. To further reduce losses through such apertures, the apertures may be covered by an electrically conducting wire mesh.

In one example embodiment, gas may be supplied directly to the resonant cavity 710 from a gas supply (not shown). One or more pumps may be provided on pipe 705 on either side of the resonant cavity 710, for example adjacent to the first and second openings 707, 709. Such an arrangement may be useful, for example, if the resonant cavity 710 is sufficiently small that it is impractical to attach a pump directly to it. Alternatively, a pump may be directly attached to the resonant cavity 710, which may allow for a higher control bandwidth of radiation sensor apparatus 700.

The gas may be any suitable gas. Suitable gases include gases for which the absorption cross section (for radiation beam 702) is sufficiently low that the volume density of un-excited gas molecules in the volume swept out by radiation beam 702 is not significantly lower than other regions of the resonant cavity 710 (i.e. those which are not swept out by the radiation beam 702).

Suitable gases may include: hydrogen, helium, nitrogen, oxygen, neon, argon, krypton or xenon.

The absorption cross section for hydrogen is $4.9 \times 10^{-24}$ m$^2$ (for a wavelength of 13.5 nm) and $5.9 \times 10^{-25}$ (for a wavelength of 6.75 nm). The absorption cross section for helium is $5.1 \times 10^{-23}$ m$^2$ (for a wavelength of 13.5 nm) and $7.7 \times 10^{-24}$ m$^2$ (for a wavelength of 6.75 nm). The absorption cross section for nitrogen is $2.3 \times 10^{-22}$ m$^2$ (for a wavelength of 13.5 nm) and $5.0 \times 10^{-23}$ m$^2$ (for a wavelength of 6.75 nm). The absorption cross section for oxygen is $3.9 \times 10^{-22}$ m$^2$ (for a wavelength of 13.5 nm) and $1.0 \times 10^{-22}$ m$^2$ (for a wavelength of 6.75 nm). The absorption cross section for neon is $4.5 \times 10^{-22}$ m$^2$ for a wavelength of 13.5 nm. The absorption cross section for argon is $1.4 \times 10^{-22}$ m$^2$ for a wavelength of 13.5 nm. The absorption cross section for krypton is $6.5 \times 10^{-22}$ m$^2$ for a wavelength of 13.5 nm. The absorption cross section for xenon is $2.5 \times 10^{-21}$ m$^2$ for a wavelength of 13.5 nm.

A relevant figure of merit FM for deciding whether or not a gas is suitable is given given by:

$$FM = \frac{\sigma P}{v_0 E_0 D}, \quad (3)$$

where $\sigma$ is the absorption cross section for radiation beam 702 (in m$^2$), P is the power of the radiation beam 702 (in W), $E_0$ is the photon energy of radiation beam 702, D is the diameter of the radiation beam 702, and $v_0$ is the mean thermal velocity of the gas molecules. This quantity FM should be significantly less than 1. In one example embodiment, P=30 kW, the gas is hydrogen with $v_0$=1.8 km/s, the wavelength of radiation beam 702 is 13.5 nm such that $E_0$=1.5×10$^{-17}$ J, and D=5 mm. For such an embodiment FM=0.001, which is acceptable. Note that this figure of merit FM is also relevant for the radiation sensor apparatus 100 described above with reference to FIGS. 4 to 12.

In locations within an optical system (e.g. lithographic system LS of FIG. 1) where the ratio of the power P of the radiation beam 702 to the diameter D of the radiation beam 702 is lower, a gas with a higher absorption cross section may be used in order to increase the sensitivity of the radiation sensor apparatus 700, if desired.

The resonant cavity 710 may be provided with a mechanism that allows a pressure difference to be maintained across each of the first and second openings 707, 709. This allows the pressure of a gas within the resonant cavity 710 to be controlled over a greater range. For example, the mechanism that allows a pressure difference to be maintained across each of the first and second openings 707, 709 may comprise a plurality of stages that form part of a differential pumping system.

The resonant frequencies of a resonant cavity are dependent upon the shape and dimensions of the cavity, which determine the boundary conditions for electromagnetic disturbances within the cavity. The resonant frequencies are also dependent upon the speed of light within the cavity, which, in turn, is determined by the permittivity and permeability of the matter within the cavity.

As a radiation beam 702 passes through the resonant cavity 710 it may interact with matter within the resonant cavity. For example, if the radiation beam 702 has a sufficiently high frequency, it may ionize a gas within the resonant cavity 710, creating a plasma. In general, the density of free electrons within the cavity 710 caused by such ionization is dependent upon the power of the radiation beam 702. The density of free electrons within the resonant cavity 710 will affect the permittivity and/or permeability within the resonant cavity 710, which in turn will affect the resonant frequencies of the resonant cavity 710. In particular, the permittivity within the resonant cavity 710 is dependent upon the density of free electrons within the resonant cavity 710.

The processor 730 is operable to use the measured resonant frequency of the resonant cavity 710 to determine a power of a radiation beam 702 propagating between the first and second openings 707, 709. This may be achieved by using a first relationship between the resonant frequency of the resonant cavity 710 and the number of electrons within the resonant cavity 710 and a second relationship between the number of electrons within the resonant cavity 710 and the intensity of radiation beam 702.

As radiation beam 702 passes through the resonant cavity 710 and ionizes gas the free electrons within the cavity 710 caused by such ionization will cause a shift $\Delta\omega$ in the resonant frequency of the resonant cavity 710. The electron density $\overline{n_e}$ (strictly the weighted average of the electron density over the volume of the resonant cavity 710, wherein the weight is the square of the electric field of the electromagnetic standing wave in the resonant cavity 710) is given by:

$$\overline{n_e} = \frac{2m\varepsilon_0}{e^2} \frac{\omega^2}{\omega_0} \Delta\omega, \quad (4)$$

where e and m are, respectively, the electric charge and mass of the electron, $\varepsilon_0$ is the permittivity of free space, $\omega_0$ is the resonant frequency of resonant cavity 710 without the plasma and $\omega$ is the resonant frequency of resonant cavity 710 with the plasma. Thus, the shift $\Delta\omega$ in the resonant frequency of the resonant cavity 710 is linearly proportional to the electron density $\overline{n_e}$. Further, if the density of the gas within the resonant cavity 710 is constant then the electron density $\overline{n_e}$ is linearly proportional to the intensity of radiation beam 702.

Therefore, radiation sensor apparatus 700 allows the power of a radiation beam 702 propagating between the first and second openings 707, 709 to be determined from a determined resonant frequency of the resonant cavity 710. In particular, radiation sensor apparatus 700 allows the power of a radiation beam 702 propagating between the first and second openings 707, 709 to be determined from a shift in a determined resonant frequency of the resonant cavity 710.

The gas provided in the resonant cavity 710 in use may be provided at a suitable operating pressure for the radiation sensor apparatus 700. The radiation sensor apparatus 700 may have a range of suitable operating pressures, which may be defined by a lower limit and an upper limit. The range of suitable operating pressures may be dependent upon the type of gas within the resonant cavity, i.e. different gases may have different ranges of suitable operating pressures. Suitable ranges of operating pressures within resonant cavity 710 are now discussed.

In order for the radiation sensor apparatus 700 to be reasonably linear, the plasma formed by the ionization of gas within the resonant cavity 710 should be sufficiently dense that newly generated photoelectrons cannot easily escape from the cloud of positive ions (and exit the resonant cavity 710). The density of a plasma is related to its Debye length. The Debye length of a plasma is a measure of the net electromagnetic effect of a charge carrier (e.g. an electron or an ion) and the typical distance scale over which that charge carrier exerts its influence. In order for the radiation sensor apparatus 700 to be reasonably linear, the Debye length of the plasma should be smaller than the diameter of the radiation beam 702. This sets a lower limit on range of suitable operating pressures of the gas within the resonant cavity 710.

The level of absorption of radiation from radiation beam 702 (i.e. the level of attenuation of radiation beam 702) is dependent on the pressure of gas within the resonant cavity 710. Higher pressure of gas within the resonant cavity 710 results in a higher level of attenuation. An acceptable or tolerable level of attenuation may therefore set an upper limit on range of suitable operating pressures of the gas within the resonant cavity 710.

For an embodiment wherein the radiation beam 102 comprises EUV radiation, with a power of the order of 1-30 kW and beam diameter of the order of 2-30 mm, a range of suitable operating pressures for hydrogen may be between 1 Pa and 100 Pa and a range of suitable operating pressures for argon may be between 0.1 Pa and 10 Pa.

The rate at which oscillations decay within a resonant cavity can be characterised by the quality factor Q of the resonant cavity. In the absence of input electromagnetic radiation (e.g. via power supply 715 and first antenna 721), the amplitude of an electromagnetic standing wave within the resonant cavity 710 will decay exponentially. The time constant T of this exponential decay is given by $T=2Q/\omega$, where $\omega$ is the angular frequency of the standing wave ($w=2\pi f$, where f is the frequency of the standing wave). The time constant T is the time taken for the amplitude of the electromagnetic standing wave to reduce by a factor of 1/e. In one embodiment the resonant cavity 710 has a quality factor Q of 150 and a frequency f of around 3.5 GHz. For such an embodiment, the time constant T is of the order of 14 ns.

In order to determine the power of a radiation beam 702 propagating between the first and second openings 707, 709, a resonant frequency, or a change in the resonant frequency, of the resonant cavity 710 may be determined.

In a first embodiment, to do this, the processor 730 may be operable to use power supply 715 and first antenna 721 to sequentially excite a plurality of standing waves with different frequencies in the resonant cavity 710 while simultaneously monitoring the amplitude of the electromagnetic wave within the resonant cavity 710. After each of the plurality of standing waves has been excited, the processor 730 may be operable to wait for a time of the order of the time constant T for the standing wave within the resonant cavity 710 to decay before exciting the next standing wave. For such embodiments, the response time of the radiation sensor apparatus 700 is proportional to the time constant T of the resonant cavity 710 and the number of different frequencies that are excited. For example, in order to measure the power of a radiation beam 702 with a resolution of around $10^{-3}$, the processor 730 may be operable to sequentially excite around 1000 standing waves with slightly different frequencies in the resonant cavity 710 while simultaneously monitoring the amplitude of the electromagnetic wave within the resonant cavity 710. The response time of the radiation sensor apparatus 700 is the time taken to do this, which is around 1000 T or, if T=14 ns, around 14 ρs. By varying the Q factor of the resonant cavity 710, the average frequency of the standing waves excited in the resonant cavity 710 and/or the number of different frequencies excited to determine the resonant frequency, the response time of the radiation sensor apparatus 700 can be varied as desired or required.

In a second embodiment, the processor 730 may be operable to determine a relative phase between: (i) the control signal 735 that is sent by the processor 730 to the power supply 715; and (ii) the signal 740 output by the second antenna 722. A change in this relative phase is a measure of a change in resonant frequency of the resonant cavity 710 and, consequently, a measure of a change in electron density within the resonant cavity 710. The change in relative phase gives both the magnitude of the change in resonant frequency and the sign of the change in resonant frequency (i.e. whether the resonant frequency has increased or decreased with respect to a set point).

In such embodiments, the processor 730 may be operable to determine the relative phase at a single, fixed frequency at, or close to the resonant frequency. This may be beneficial because a measurement at a single frequency, or at a relatively small number of frequencies, can be made more quickly than the above-described embodiment wherein the processor 730 sequentially excites a large number (for example around 1000) of standing waves with slightly different frequencies. Therefore embodiments wherein the processor 730 uses the relative phase between the control signal 735 and signal 740 to determine the resonant frequency of the resonant cavity 710 (and, ultimately, the power of radiation beam 702) may have a significantly smaller response time than, for example, embodiments wherein the processor 730 sequentially excites a large number (for example around 1000) of standing waves with slightly different frequencies.

As can be seen in FIG. 14, at the resonant frequency $f_0$, the differential of the amplitude 760 of response with respect to frequency is zero. Therefore, at or close to resonance a change in the driving frequency (i.e. the output frequency of the power supply 715) will result in a relatively small change in the amplitude of the electromagnetic wave within the resonant cavity 710 (or, equivalently, the amplitude of signal 740). This limits the accuracy with which changes in resonant frequency can be determined by scanning the frequency of the power supply 715 (for example by sequentially exciting a large number of standing waves with slightly different frequencies). Frequency can be determined with an accuracy of $(\sqrt{S}/Q) \cdot f_0$, where S is the signal accuracy (which depends on measurement equipment), $f_0$ the resonant frequency and Q is the quality factor of the cavity. As an example, in an embodiment the power of the electromagnetic wave in the resonant cavity 710 can be determined with an accuracy of 1% and the Q factor is 100, then the frequency can be determined with an accuracy of $(10^{-3}) \cdot f_0$. For such embodiments, the accuracy of the frequency measurement is therefore around 1-10 MHz for $f_0$ in the range 1-10 GHz.

In contrast, the relative phase between the control signal 735 and signal 740 can be measured more accurately than the peak power of the electromagnetic wave in the resonant cavity 710 at resonance. For example, in some embodiments the relative phase can be measured with an estimated accuracy of 1 mrad. This corresponds to a frequency change of $((10^{-3})/(\pi/4) \cdot Q) \cdot f_0$. With a Q factor of 100, the frequency can therefore be determined with an accuracy of approximately $(10^{-5}) \cdot f_0$. For such embodiments, the accuracy for the frequency measurement is therefore around 10-100 kHz for $f_0$ in the range 1-10 GHz. Therefore embodiments wherein the processor 730 uses the relative phase between the control signal 735 and signal 740 to determine the resonant frequency of the resonant cavity 710 (and, ultimately, the power of radiation beam 702) may have a significantly better resolution than, for example, embodiments wherein the processor 730 sequentially excites a large number (for example around 1000) of standing waves with slightly different frequencies. With the above-described numerical examples the resolution may be improved by a factor of the order of 100.

Figure 13A:
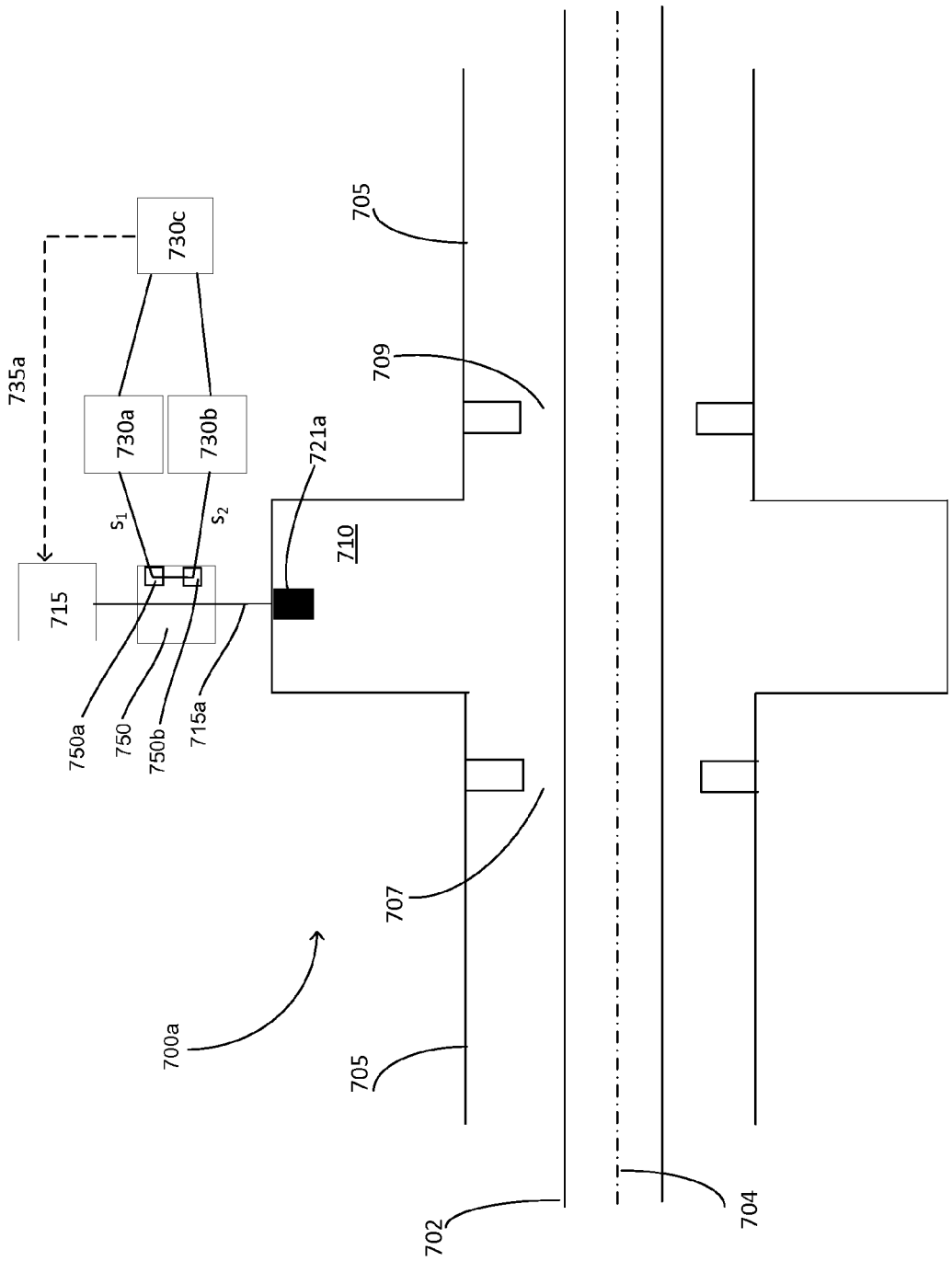
FIG. 13A is a schematic illustration of a second embodiment of a second type of radiation sensor apparatus which may form part of the lithographic system of FIG. 1 in cross section in a plane perpendicular to its axis.

Another embodiment of a second type of radiation sensor apparatus which is suitable for use in a lithographic system LS is now described with reference to FIG. 13A. FIG. 13A is a schematic illustration of a radiation sensor apparatus 700a which is suitable for use in a lithographic system LS. The radiation sensor apparatus 700a of FIG. 13A is a variant of the radiation sensor apparatus 700 of FIG. 13. Only the differences between the radiation sensor apparatus 700a of FIG. 13A and the radiation sensor apparatus 700 of FIG. 13 will be described in detail below. Corresponding features of radiation sensor apparatus 700a and radiation sensor apparatus 700 share common reference numerals.

Radiation sensor apparatus 700a comprises a resonant cavity 710, a single antenna 721a and a processor 730c. The antenna 721a is provided on a curved wall of the cylindrical cavity 710. In an alternative embodiment, the antennae 721a may be disposed outside of the resonant cavity 710 and may be coupled to the resonant cavity 710, for example by a waveguide.

A transmission line 715a extends from the power supply 715 to the antenna 721a via a directional coupler 750. The directional coupler 750 comprises two ports 750a, 750b. Each of the two ports 750a, 750b of the directional coupler 750 is connected to a device 730a and 730b, which is operable to measure the phase and/or amplitude of a wave propagating between the power supply 715 and the antenna 721a. Device 730a is arranged to measure the phase and/or amplitude of a wave propagating from the power supply 715 to the antenna 721a. Device 730b is arranged to measure the phase and/or amplitude of a reflected wave received by the antenna 721a. The directional coupler 750 and devices 730a and 730b together form a reflectometer. If the frequency of the power supply 715 (e.g. an RF source) exactly matches the resonance frequency of the resonant cavity 710 then the amplitude of the reflected wave propagating from the antenna 721a to the power supply 715 may be zero. Otherwise, the amplitude of the reflected wave propagating from the antenna 721a to the power supply 715 may be non-zero.

The processor 730c is operable to measure a resonant frequency of the resonant cavity 710. The processor is arranged to receive a signal $s_1$, $s_2$ output by each of the devices 730a, 730b. The processor 730c is operable to control the power supply 715 so as to control the frequency of the electromagnetic wave that is exited within the resonant cavity 710 by the antenna 721a. For example, the processor 730 may be operable to send a control signal 735a to the power supply 715. In turn, the frequency supplied to the antenna 721a by power supply 715 may be chosen in dependence on the control signal 735a.

In one embodiment, in order to determine a resonant frequency of the resonant cavity 710, the processor 730c may be operable to control the power supply 715 so as to vary the frequency of the electromagnetic wave that is exited within the resonant cavity 710 and to simultaneously monitor the amplitude of the reflected wave propagating from the antenna 721a to the power supply 715. To do this, the processor 730c may be operable to use power supply 715 and antenna 721a to sequentially excite a plurality of standing waves with different frequencies in the resonant cavity 710. After each of the plurality of standing waves has been excited, the processor 730a may be operable to monitor the amplitude of a reflected wave received by the antenna 721a. Monitoring the amplitude of the reflected wave received by the antenna 721a may be achieved by monitoring the signal $s_2$ output by device 730b. Once the amplitude of a reflected wave received by the antenna 721a has been determined, the processor 730a may be operable to wait for a time of the order of the time constant T for the standing wave within the resonant cavity 710 to decay before exciting the next standing wave. The processor 730c may determine the resonant frequency of the resonant cavity 710 to be a frequency at which the amplitude of the reflected wave received by the antenna 721a is zero, or a frequency at which a local minimum occurs in the amplitude of the reflected wave received by the antenna 721a.

In another embodiment, the processor 730a may be operable to determine a relative phase between: (i) a wave propagating from the power supply 715 to the antenna 721a; and (ii) a reflected wave received by the antenna 721a. A change in this relative phase is a measure of a change in resonant frequency of the resonant cavity 710 and, consequently, a measure of a change in electron density within the resonant cavity 710. The change in relative phase gives both the magnitude of the change in resonant frequency and the sign of the change in resonant frequency (i.e. whether the resonant frequency has increased or decreased with respect to a set point).

Determining the relative phase between a wave propagating from the power supply 715 to the antenna 721a; and a reflected wave received by the antenna 721a may be achieved by determining a relative phase between the signal $s_1$ output by device 730a and the signal $s_2$ output by device 730b.

Such embodiments may have a significantly smaller response time and/or a significantly better resolution than, for example, embodiments wherein the processor 730a sequentially excites a large number (for example around 1000) of standing waves with slightly different frequencies.

Whilst embodiments of a radiation source SO have been described and depicted as comprising a free electron laser FEL, it should be appreciated that a radiation source may comprise any number of free electron lasers FEL. For example, a radiation source may comprise more than one free electron laser FEL. For example, two free electron lasers may be arranged to provide EUV radiation to a plurality of lithographic apparatuses. This is to allow for some redundancy. This may allow one free electron laser to be used when the other free electron laser is being repaired or undergoing maintenance.

Although the described embodiment of a lithographic system LS comprises eight lithographic apparatuses $LA_a$-$LA_n$, a lithographic system LS may comprise any number of lithographic apparatus. The number of lithographic apparatus which form a lithographic system LS may, for example, depend on the amount of radiation which is output from a radiation source SO and on the amount of radiation which is lost in a beam delivery system BDS. The number of lithographic apparatus which form a lithographic system LS may additionally or alternatively depend on the layout of a lithographic system LS and/or the layout of a plurality of lithographic systems LS.

Embodiments of a lithographic system LS may also include one or more mask inspection apparatus MIA and/or one or more Aerial Inspection Measurement Systems (AIMS). In some embodiments, the lithographic system LS may comprise a plurality of mask inspection apparatuses to allow for some redundancy. This may allow one mask inspection apparatus to be used when another mask inspection apparatus is being repaired or undergoing maintenance. Thus, one mask inspection apparatus is always available for use. A mask inspection apparatus may use a lower power radiation beam than a lithographic apparatus. Further, it will be appreciated that radiation generated using a free electron laser FEL of the type described herein may be used for applications other than lithography or lithography related applications.

The term "relativistic electrons" should be interpreted to mean electrons which have relativistic energies. An electron may be considered to have a relativistic energy when its kinetic energy is comparable to or greater than its rest mass energy (511 keV in natural units). In practice a particle accelerator which forms part of a free electron laser may accelerate electrons to energies which are much greater than its rest mass energy. For example a particle accelerator may accelerate electrons to energies of >10 MeV, >100 MeV, >1 GeV or more.

Embodiments of the invention have been described in the context of a free electron laser FEL which outputs an EUV radiation beam. However a free electron laser FEL may be configured to output radiation having any wavelength. Some embodiments of the invention may therefore comprise a free electron which outputs a radiation beam which is not an EUV radiation beam.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

The lithographic apparatuses $LA_a$ to $LA_n$ may be used in the manufacture of ICs. Alternatively, the lithographic apparatuses $LA_a$ to $LA_n$ described herein may have other applications. Possible other applications include the manufacture of integrated optical systems, guidance and detection patterns for magnetic domain memories, flat-panel displays, liquid-crystal displays (LCDs), thin-film magnetic heads, etc.

Different embodiments may be combined with each other. Features of embodiments may be combined with features of other embodiments.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A radiation sensor apparatus for determining a power of a radiation beam, the radiation sensor apparatus comprising:
   a resonant cavity for containing a gas, the resonant cavity having a first opening and a second opening such that a radiation beam can enter the resonant cavity through the first opening, propagate through the resonant cavity generally along an axis, and exit the resonant cavity through the second opening;
   a source operable to excite an electromagnetic wave within the resonant cavity; and
   a processor configured to at least:
      measure a resonant frequency of the resonant cavity or a quantity indicative of a resonant frequency of the resonant cavity; and
      use the measured resonant frequency or quantity indicative of the resonant frequency to determine a power of a radiation beam propagating between the first and second openings.

2. The radiation sensor apparatus of claim 1, wherein the processor is configured to control the frequency of the electromagnetic wave that is excited within the resonant cavity by the source.

3. The radiation sensor of claim 2, wherein the processor is configured to control the source so as to sequentially excite a plurality of standing waves with different frequencies in the resonant cavity while simultaneously monitoring the amplitude of the electromagnetic wave within the resonant cavity.

4. The radiation sensor of claim 3, wherein the processor is configured to determine the resonant frequency of the resonant cavity to be a frequency at which a local maximum occurs in the amplitude of the electromagnetic wave within the resonant cavity.

5. The radiation sensor apparatus of claim 1, further comprising a receiver operable to:
   monitor the electromagnetic wave within the resonant cavity; and
   output a signal indicative of the amplitude and/or phase of the electromagnetic wave within the resonant cavity, and
   wherein the processor is arranged to receive the signal from the receiver.

6. The radiation sensor apparatus of claim 1, further comprising a directional coupler configured to:
   monitor a reflected wave received by the source; and
   output a signal indicative of the amplitude and/or of the reflected wave, and
   wherein the processor is arranged to receive the signal from the directional coupler.

7. The radiation sensor apparatus of claim 6, wherein the directional coupler is further configured to:
   monitor a wave generated by a power supply of the source; and
   output a signal indicative of the amplitude and/or phase of the wave generated by the power supply of the source, and
   wherein the processor is arranged to receive the signal from the directional coupler.

8. The radiation sensor apparatus of claim 1, wherein the processor is configured to determine a relative phase between an electromagnetic wave supplied by a power supply of the source, and the electromagnetic wave excited within the resonant cavity by the source.

9. The radiation sensor apparatus of claim 8, wherein the processor is further configured to determine the resonant frequency of the resonant cavity in dependence on the determined relative phase.

10. The radiation sensor apparatus of claim 1, further comprising a gas supply mechanism configured to supply a gas into the resonant cavity.

11. The radiation sensor apparatus of claim 10, wherein the gas supply mechanism comprises:
a gas supply configured to deliver gas into the resonant cavity; and
a pressure sensor configured to monitor a pressure of gas within the resonant cavity.

12. The radiation sensor apparatus of claim 11, wherein the gas supply and pressure sensor form a feedback loop that is configured to control the pressure of gas within the resonant cavity.

13. The radiation sensor apparatus of claim 12, wherein the gas supply mechanism is configured to maintain a constant pressure of gas in the resonant cavity.

14. The radiation sensor apparatus of claim 10, wherein the gas supply mechanism further comprises a pump which is operable to pump gas out of the resonant cavity.

15. The radiation sensor apparatus of claim 1, further comprising a mechanism arranged to maintain a constant pressure of gas in the resonant cavity.

16. The radiation sensor apparatus of claim 1, wherein the first and second openings have a mechanism that allows a pressure difference to be maintained across each of the first and second openings.

17. The radiation sensor apparatus of claim 1, configured to determine a power of an electromagnetic radiation beam.

18. The radiation sensor apparatus of claim 1, configured to determine a power of a pulsed radiation beam.

19. A method for determining a power of a radiation beam, the method comprising:
directing the radiation beam through a resonant cavity containing a gas, the resonant cavity having a first opening and a second opening, wherein the radiation beam enters the resonant cavity through the first opening, propagates through the resonant cavity, and exits the resonant cavity through the second opening;
exciting an electromagnetic wave within the resonant cavity;
monitoring the electromagnetic wave within the resonant cavity;
determining a resonant frequency of the resonant cavity; and
in dependence on the determined resonant frequency, determining a power of the radiation beam propagating between the first and second openings.

20. The method of claim 19, wherein the radiation beam comprises electromagnetic radiation in the deep ultraviolet or extreme ultraviolet range.

21. The method of claim 19, wherein the radiation beam is a pulsed radiation beam.

* * * * *